United States Patent
Hara et al.

(10) Patent No.: US 7,816,998 B2
(45) Date of Patent: Oct. 19, 2010

(54) FILM BULK ACOUSTIC RESONATOR AND FILTER

(75) Inventors: Motoaki Hara, Kawasaki (JP); Tokihiro Nishihara, Kawasaki (JP); Masanori Ueda, Kawasaki (JP); Go Endo, Yokohama (JP)

(73) Assignees: Fujitsu Media Devices Limited, Yokohama (JP); Taiyo Yuden Co., Ltd., Tokyo (JP)

( * ) Notice: Subject to any disclaimer, the term of this patent is extended or adjusted under 35 U.S.C. 154(b) by 159 days.

(21) Appl. No.: 12/000,654

(22) Filed: Dec. 14, 2007

(65) Prior Publication Data

US 2008/0150653 A1  Jun. 26, 2008

(30) Foreign Application Priority Data

Dec. 15, 2006 (JP) .............................. 2006-337711

(51) Int. Cl.
 *H03H 9/54* (2006.01)
 *H03H 9/15* (2006.01)
(52) U.S. Cl. .................. 333/187; 333/189; 310/312; 310/324
(58) Field of Classification Search ......... 333/186–189; 310/324, 326, 335, 312
See application file for complete search history.

(56) References Cited

U.S. PATENT DOCUMENTS

| | | | |
|---|---|---|---|
| 6,424,237 B1 * | 7/2002 | Ruby et al. ............. | 333/187 |
| 7,161,447 B2 * | 1/2007 | Nomura et al. .......... | 333/187 |
| 7,161,448 B2 * | 1/2007 | Feng et al. .............. | 333/187 |
| 7,199,683 B2 * | 4/2007 | Thalhammer et al. .... | 333/187 |
| 7,280,007 B2 * | 10/2007 | Feng et al. ............. | 333/187 |
| 2002/0079986 A1 | 6/2002 | Ruby et al. | |
| 2007/0210877 A1 * | 9/2007 | Osugi et al. ........... | 333/187 |
| 2008/0051039 A1 * | 2/2008 | Iwasaki et al. ......... | 455/73 |
| 2008/0143215 A1 * | 6/2008 | Hara et al. ............ | 310/328 |

FOREIGN PATENT DOCUMENTS

| | | |
|---|---|---|
| JP | 60-189307 | 9/1985 |
| JP | 2002-223144 | 8/2002 |

OTHER PUBLICATIONS

Electronic Letters, 9$^{th}$ Jul. 1981, vol. 17, No. 14, pp. 507-509, "ZnO/SiO2—Diaphragm Composite Resonator On A Silicon Wafer", Nakamura et al.

* cited by examiner

*Primary Examiner*—Barbara Summons
(74) *Attorney, Agent, or Firm*—Arent Fox LLP

(57) ABSTRACT

A film bulk acoustic resonator includes a lower electrode that is formed on a void of a substrate or is formed so that a void is formed between the lower electrode and the substrate, a piezoelectric film that is formed on the lower electrode, an upper electrode that is formed on the piezoelectric film so as to have a resonance region facing the lower electrode through the piezoelectric film, a support region that is provided around the resonance region, has a width of 0.35 times to 0.65 times a wavelength of a wave propagating in a lateral direction, and transmits the wave passes, and an adjacent region that is provided around the support region and blocks the wave.

9 Claims, 29 Drawing Sheets

PRIOR ART

PRIOR ART

PRIOR ART

PROPAGATION FACTOR

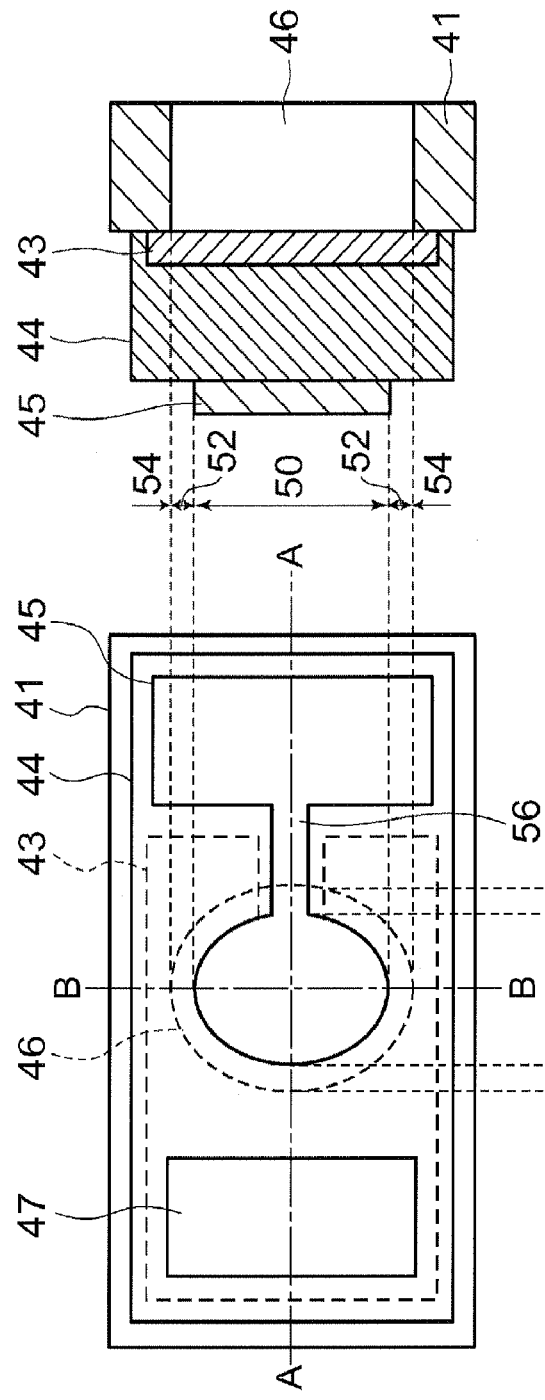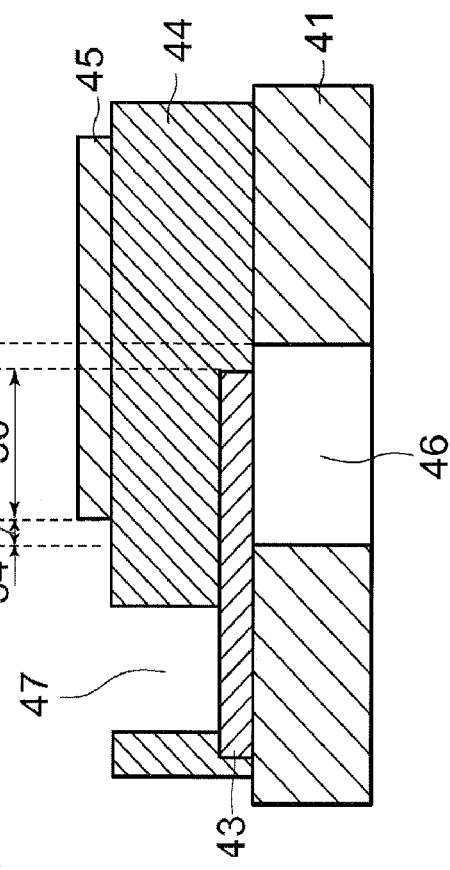

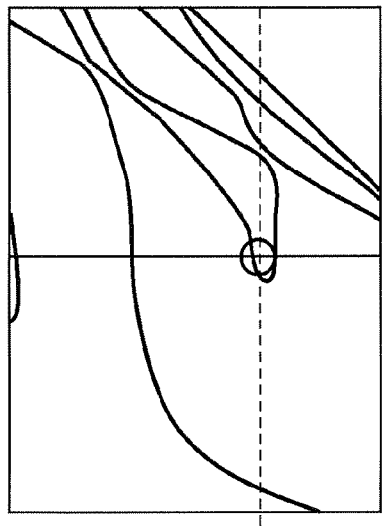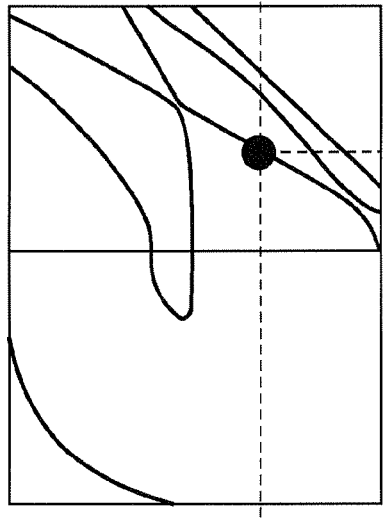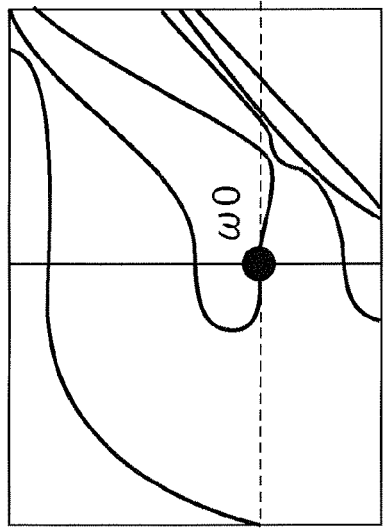

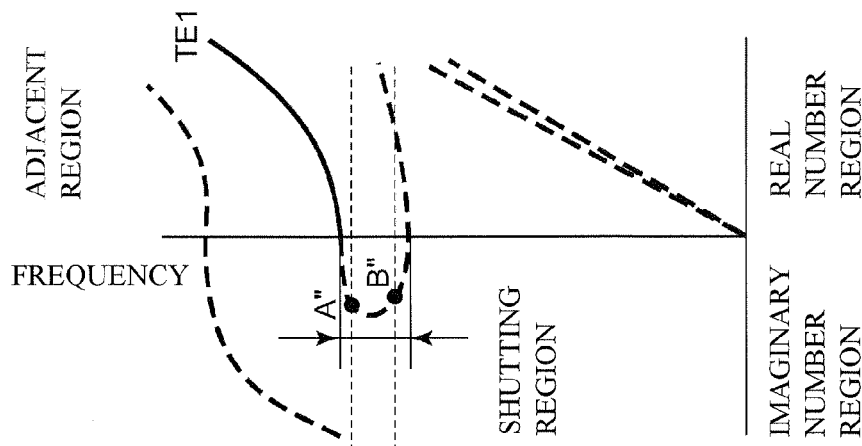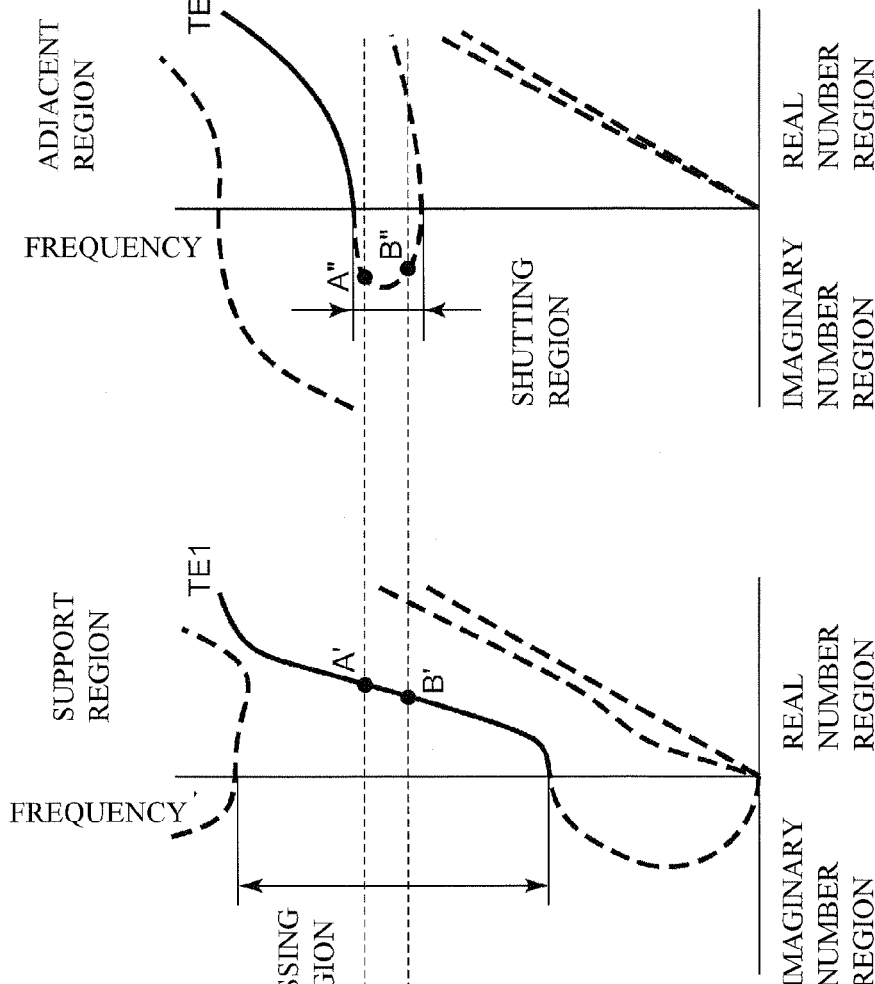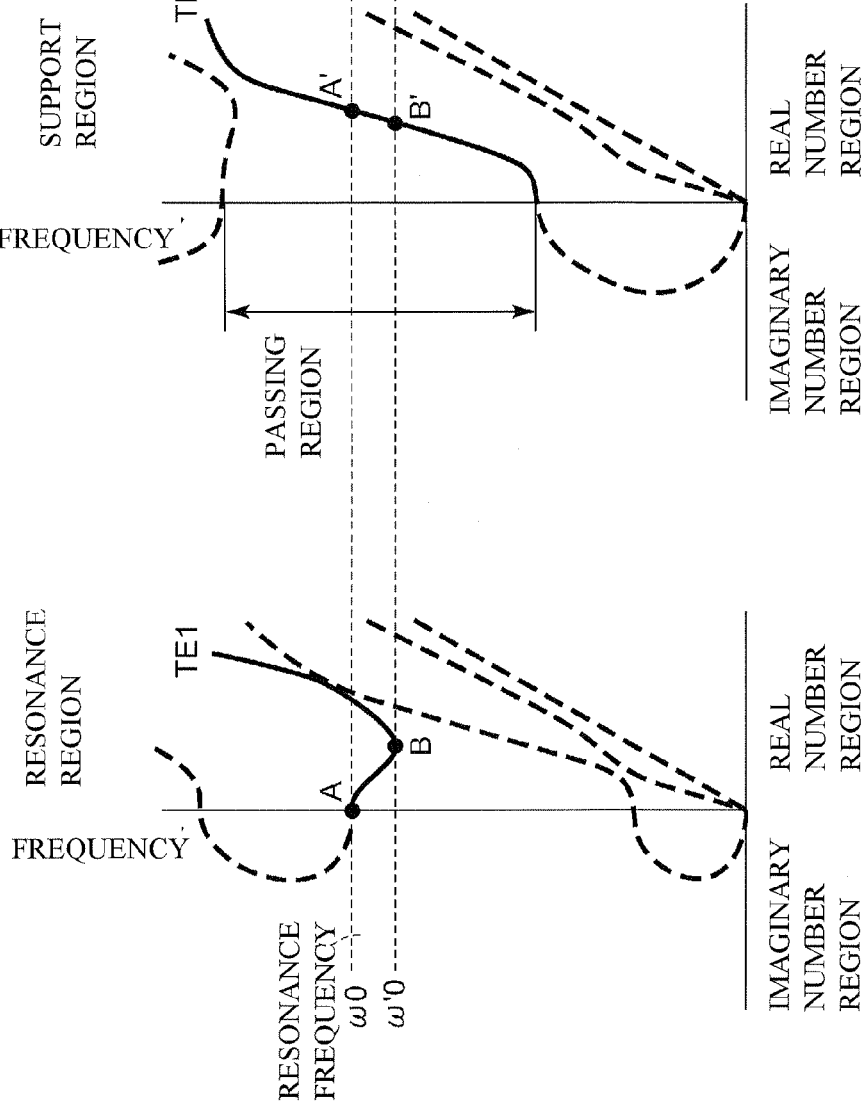

L=0.25λ

L=0.30λ

L=0.35λ

$L=0.40\lambda$ $L=0.45\lambda$ $L=0.50\lambda$

L=0.55λ

L=0.60λ

L=0.65λ

L=0.70 λ

L=0.75 λ

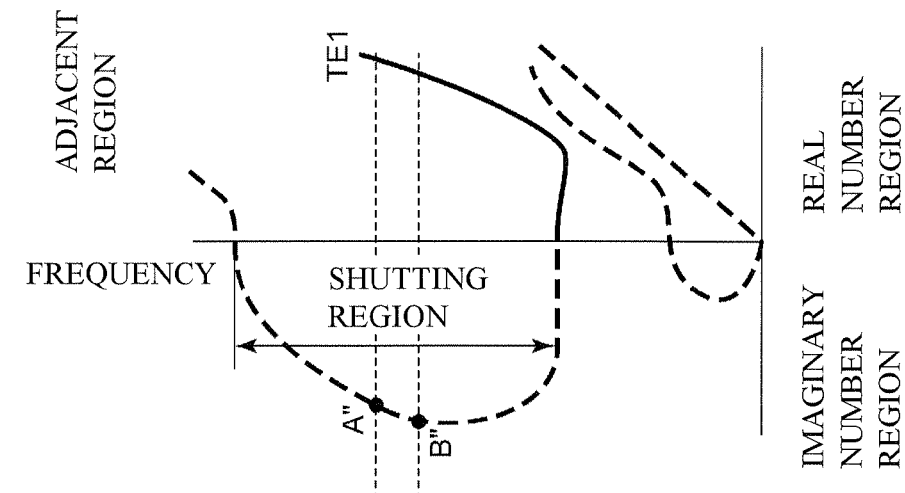
FIG. 22C
FIG. 22B
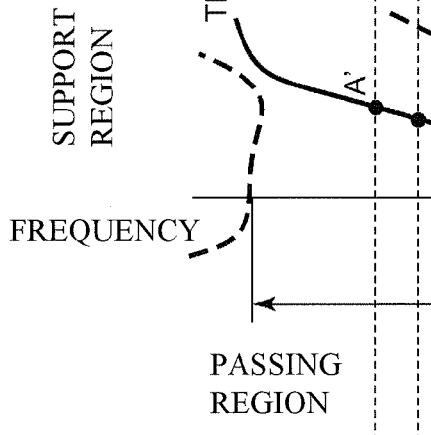
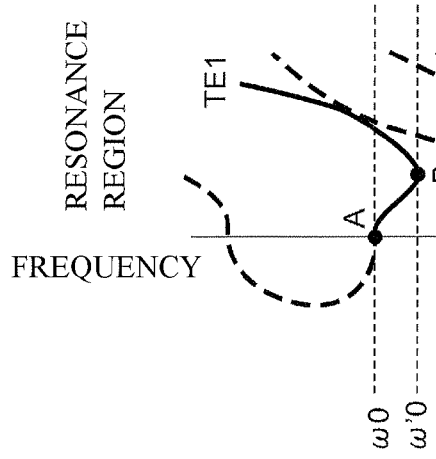
FIG. 22A

FILM BULK ACOUSTIC RESONATOR AND FILTER

BACKGROUND OF THE INVENTION

1. Field of the Invention

The present invention relates to a film bulk acoustic resonator and a filter, in particular, relates to a film bulk acoustic resonator and a filter that include a cavity below a resonance region in which an upper electrode and a lower electrode are facing each other through a piezoelectric film.

2. Description of the Related Art

There is increased a demand for a small and lightweight resonator and a filter with the resonator, because of a rapid diffusion of a wireless device such as a mobile phone. A dielectric and a surface acoustic wave (SAW) filter are mainly used until now. Recently, there is noted a piezoelectric film resonator and a filter including the piezoelectric film resonator that have a good characteristic at a high frequency in particular and can be downsized and monolithically-integrated.

A resonator of FBAR (Film Bulk Acoustic Resonator) type is known as one type of a piezoelectric thin film resonator. The FBAR has a laminate structure composed of an upper electrode, a piezoelectric film, and a lower electrode on a substrate. The FBAR has a via-hole or a cavity (a void) under a region of the lower electrode facing the upper electrode in order to restrain a dissipation of vibration energy to a substrate. There may be formed a void under the lower electrode through a dielectric film. The via-hole is formed if a back face of a Si substrate used as an element substrate is subjected to an etching treatment. The cavity is formed, if a resonance element such as a composite film is formed on a sacrifice layer pattern on a surface of a substrate, and the sacrifice layer pattern is eliminated at last. A film bulk acoustic resonator including a via-hole and a cavity as a void is hereinafter referred to as a via-hole type or a cavity type.

An acoustic wave excited with an inverse piezoelectric effect or an acoustic wave generated by a distortion caused by a piezoelectric effect is generated in the piezoelectric film between the upper electrode and the lower electrode, when an electrical signal at high frequency is provided to between the upper electrode and the lower electrode. These acoustic waves are converted into an electrical signal. The acoustic wave is converted into a longitudinal vibration wave having a main displacement in a thickness direction, because the acoustic wave is totally reflected at a face of the upper electrode and a face of the lower electrode that contact to air. In the element structure, a resonation is occurred at a frequency where a thickness H of a laminate structure composed of the upper electrode, the piezoelectric film and the lower electrode formed above the cavity is integral multiple of a half of the acoustic wave. A propagation velocity V of the acoustic wave is determined according to a material. A resonance frequency F is obtained by $F=nV/2H$ ("n" is a given value). It is possible to control the resonance frequency with use of the thickness as a parameter, if the resonance is used. And it is possible to fabricate a resonator and a filter using a desirable frequency characteristic.

The upper electrode and the lower electrode may be made of a metal such as aluminum (Al), copper (Cu), molybdenum (Mo), tungsten (W), tantalum (Ta), platinum (Pt), ruthenium (Ru), rhodium (Rh), iridium (Ir), chromium (Cr), or titanium (Ti), or a lamination material made of the above-mentioned metal. The piezoelectric film may be made of aluminum nitride (AlN), zinc oxide (ZnO), lead zirconate titanate (PZT), lead titanate ($PbTiO_3$) or the like. In particular, aluminum nitride and zinc oxide are suitable for the piezoelectric film because aluminum nitride and zinc oxide have an aligned axis in (002) direction when being formed. The substrate may be made of silicon (Si), glass, gallium arsenic (GaAs) or the like.

FIG. 1 illustrates a cross sectional view showing a via-hole type of a film bulk acoustic resonator disclosed in Electron. Lett., pages 507 to 509, volume 17, 1981. As shown in FIG. 1, the film bulk acoustic resonator has a laminate structure in which there are laminated an Au—Cr film acting as a lower electrode 13, a ZnO film acting as a piezoelectric film 14 and an Al film acting as an upper electrode 15 on a (100) Si substrate 11 having a thermally oxidized film ($SiO_2$) 12. There is formed a cavity (via hole) 16 under the laminate structure. The cavity 16 is formed from a back face of the (100) Si substrate 11 with an anisotropic etching using IKOH aqueous solution or EDP aqueous solution (a liquid mixture of ethylenediamine, pyrocatechol and water).

FIG. 2 illustrates a cross sectional view showing a cavity type of a film bulk acoustic resonator disclosed in Japanese Patent Application Publication No. 60-189307. As shown in FIG. 2, the film bulk acoustic resonator has a laminate structure in which there are laminated a lower electrode 23, a piezoelectric film 24 and an upper electrode 25 on a substrate 21 having a thermally oxidized film ($SiO_2$) 22. There is formed a cavity 26 under the laminate structure. The cavity 26 is formed with processes of forming an island shaped ZnO sacrifice layer pattern on the substrate 21 in advance, forming the laminate structure on the sacrifice layer pattern, and removing the sacrifice layer under the laminate structure with an etching liquid such as an acid.

These film bulk acoustic resonators have a resonance region in which the lower electrodes 13 and 23 and the upper electrodes 15 and 25 are facing each other through the piezoelectric films 14 and 24. A high quality factor Q is obtained when vibration energy is confined in the resonance region. For example, Japanese Patent Application Publication No. 2002-223144 (hereinafter referred to as Document 1) discloses an art where an energy loss caused by an acoustic wave propagating in a lateral direction is reduced and the quality factor Q is improved.

FIG. 3 illustrates a cross sectional view of the film bulk acoustic resonator disclosed in Document 1. A lower electrode 33 is formed on a substrate 31 through a cavity 36. A piezoelectric film 34 is formed on the lower electrode 33. An upper electrode 35 is formed on the piezoelectric film 34. A resonance region 50 is a region where the lower electrode 33 faces the upper electrode 35 through the piezoelectric film 34. A support region 52 is provided around the resonance region 50. An adjacent region 54 is provided around the support region 52. The support region 52 is composed of the lower electrode 33 and the piezoelectric film 34 above the cavity 36. The adjacent region 54 is composed of the substrate 31, the lower electrode 33 and the piezoelectric film 34. A width L of the support region 52 and the adjacent region 54 is determined to be ¼ of a wavelength of an acoustic wave propagating in a lateral direction. In this case, it is possible to confine the acoustic wave in the resonance region 50. And it is possible to improve a quality factor Q.

However, in the resonator disclosed in Document 1, a spurious (an unnecessary response) is occurred at a frequency lower than the resonance frequency. FIG. 4 illustrates a Smith chart of a resonator where a spurious is occurred. The spurious is occurred in a frequency range lower than a resonance point. A description will be given of a case where a resonator in which the spurious is occurred is used in a ladder type of a filter shown in FIG. 5. As shown in FIG. 5, series resonators S1 through Sn are connected in series between an input terminal In and an output terminal Out. Parallel resonators P1 through Pn are connected in parallel between a ground and the input terminal In and the output terminal Out. FIG. 6 illustrates an amount of a loss with respect to a frequency in a case where the resonator in which the spurious is occurred is used in the ladder type of the filter. A characteristic degradation caused by the spurious is observed in a frequency range A on the lower frequency side in a transmitting property. It is important to restrain the spurious in the resonator.

SUMMARY OF THE INVENTION

The present invention has been made in view of the above circumstances and provides a film bulk acoustic resonator and a filter that restrain a spurious.

According to an aspect of the present invention, there is provided a film bulk acoustic resonator including a lower electrode, a piezoelectric film, an upper electrode, a support region and an adjacent region. The lower electrode is formed on a void of a substrate or is formed so that a void is formed between the lower electrode and the substrate. The piezoelectric film is formed on the lower electrode. The upper electrode is formed on the piezoelectric film so as to have a resonance region facing the lower electrode through the piezoelectric film. The support region is provided around the resonance region, has a width of 0.35 times to 0.65 times a wavelength of a wave propagating in a lateral direction, and transmits the wave passes. The adjacent region is provided around the support region and blocks the wave. With the structure, a vibration of an end part of the resonance region is not restrained, because the support region transmits a wave propagating in the lateral direction and the width of the support region is approximately a half of the wavelength of the wave. It is therefore possible to restrain a thermal energy loss and a spurious.

According to another aspect of the present invention, there is provided a film bulk acoustic resonator including a lower electrode, a piezoelectric film, an upper electrode, a support region, and an adjacent region. The lower electrode is formed on a void of a substrate or is formed so that a void is formed between the lower electrode and the substrate. The piezoelectric film is formed on the lower electrode. The upper electrode is formed on the piezoelectric film so as to have a resonance region facing the lower electrode through the piezoelectric film. The support region is provided around the resonance region, has a width of 0.35 times to 0.65 times a wavelength of a wave propagating in a lateral direction, and is composed of the lower electrode and the piezoelectric film on the void. The adjacent region is provided around the support region and is composed of the substrate, the lower electrode and the piezoelectric film. With the structure, it is possible to restrain a spurious.

According to another aspect of the present invention, there is provided a film bulk acoustic resonator including a lower electrode, a piezoelectric film, au upper electrode, a support region and an adjacent region. The lower electrode is formed on a void of a substrate or is formed so that a void is formed between the lower electrode and the substrate. The piezoelectric film is formed on the lower electrode. The upper electrode is formed on the piezoelectric film so as to have a resonance region facing the lower electrode through the piezoelectric film. The support region is provided around the resonance region, has a width of 0.35 times to 0.65 times a wavelength of a wave propagating in a lateral direction, and is composed of the piezoelectric film and the upper electrode on the void. The adjacent region is provided around the support region and is composed of the substrate, the piezoelectric film and the upper electrode. With the structure, it is possible to restrain a spurious.

According to another aspect of the present invention, there is provided a film bulk acoustic resonator including a lower electrode, a piezoelectric film, an upper electrode, a support region and an adjacent region. The lower electrode is formed on a void of a substrate or is formed so that a void is formed between the lower electrode and the substrate. The piezoelectric film is formed on the lower electrode. The upper electrode is formed on the piezoelectric film so as to have a resonance region facing the lower electrode through the piezoelectric film. The support region is provided around the resonance region, has a width of 0.35 times to 0.65 times a wavelength of a wave propagating in a lateral direction, and is composed of the piezoelectric film and one of the lower electrode and the upper electrode on the void. The adjacent region is provided around the support region and is composed of the piezoelectric film on the void. With the structure, it is possible to restrain a spurious.

According to another aspect of the present invention, there is provided a film bulk acoustic resonator including a lower electrode, a piezoelectric film, an upper electrode, a support region and an adjacent region. The lower electrode is formed on a void of a substrate or is formed so that a void is formed between the lower electrode and the substrate. The piezoelectric film is formed on the lower electrode. The upper electrode is formed on the piezoelectric film so as to have a resonance region facing the lower electrode through the piezoelectric film. The support region is provided around the resonance region and is composed of the piezoelectric film and one of the lower electrode and the upper electrode on the void. The adjacent region is provided around the support region and is composed of the piezoelectric film, one of the lower electrode and the upper electrode, and a weight adding film on the void. With the structure, it is possible to restrain a spurious.

According to another aspect of the present invention, there is provided a filter including a film bulk acoustic resonator having a lower electrode, a piezoelectric film, an upper electrode, a support region, and an adjacent region. The lower electrode is formed on a void of a substrate or is formed so that a void is formed between the lower electrode and the substrate. The piezoelectric film is formed on the lower electrode. The upper electrode is formed on the piezoelectric film so as to have a resonance region facing with the lower electrode through the piezoelectric film. The support region is provided around the resonance region and having a width of 0.35 times to 0.65 times a wavelength of a wave propagating in a lateral direction, through which the wave passes. The adjacent region is provided around the support region and blocks the wave. With the structure, it is possible to restrain a spurious of a resonator composing the filter. And it is possible to improve a filter property such as a transmitting property.

BRIEF DESCRIPTION OF THE DRAWINGS

Preferred embodiments of the present invention will be described in detail with reference to the following drawings, wherein:

FIG. 9A illustrates a top view of a film bulk acoustic resonator in accordance with a first embodiment;

FIG. 9B illustrates a schematic cross sectional view taken along a line A-A of FIG. 9A;

FIG. 9C illustrates a schematic cross sectional view taken along a lone B-B of FIG. 9A;

FIG. 14A through FIG. 14C illustrate a calculated result of a dispersion property of the film bulk acoustic resonator in accordance with the first embodiment;

FIG. 15A through FIG. 15C illustrate a schematic view of a dispersion property of the film bulk acoustic resonator in accordance with the first embodiment;

FIG. 22A through FIG. 22C illustrate a schematic view of a dispersion property of the film bulk acoustic resonator in accordance with the second embodiment;

DESCRIPTION OF THE PREFERRED EMBODIMENTS

Figure 7:
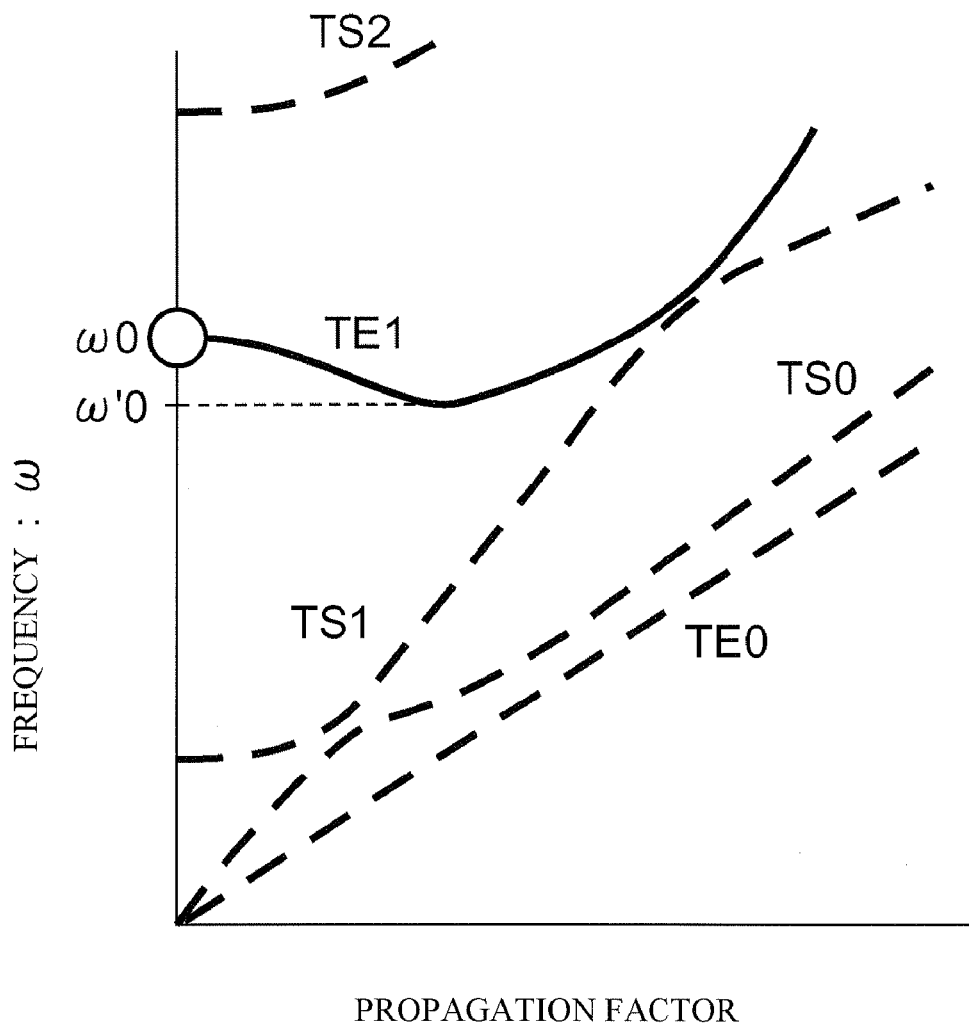
FIG. 7 illustrates a dispersion property of a wave mode.

A description will be given of a principle of the present invention. FIG. 7 illustrates a schematic view of a dispersion property of a vibration mode of an acoustic wave in the resonator shown in FIG. 3. A vertical axis indicates an exciting frequency. A horizontal axis indicates a propagation factor of a vibration of an acoustic wave in a lateral direction of each vibration mode with use of a wave number k. A thickness longitudinal vibration being a main mode is a TE1 mode, in a case where a piezoelectric film is made of a material such as AlN (aluminum nitride) having a poison ratio less than 1/3. A dispersion curve of the TE1 mode is illustrated with a solid line. A cut-off frequency is at a point where the dispersion curve of the TE1 mode is crossed with the frequency axis. The cut-off frequency approximately corresponds to a resonance frequency of a resonance element. The other vibration modes TE0, TS0, TS1 and TS2 are illustrated with a dotted line.

Figure 8:
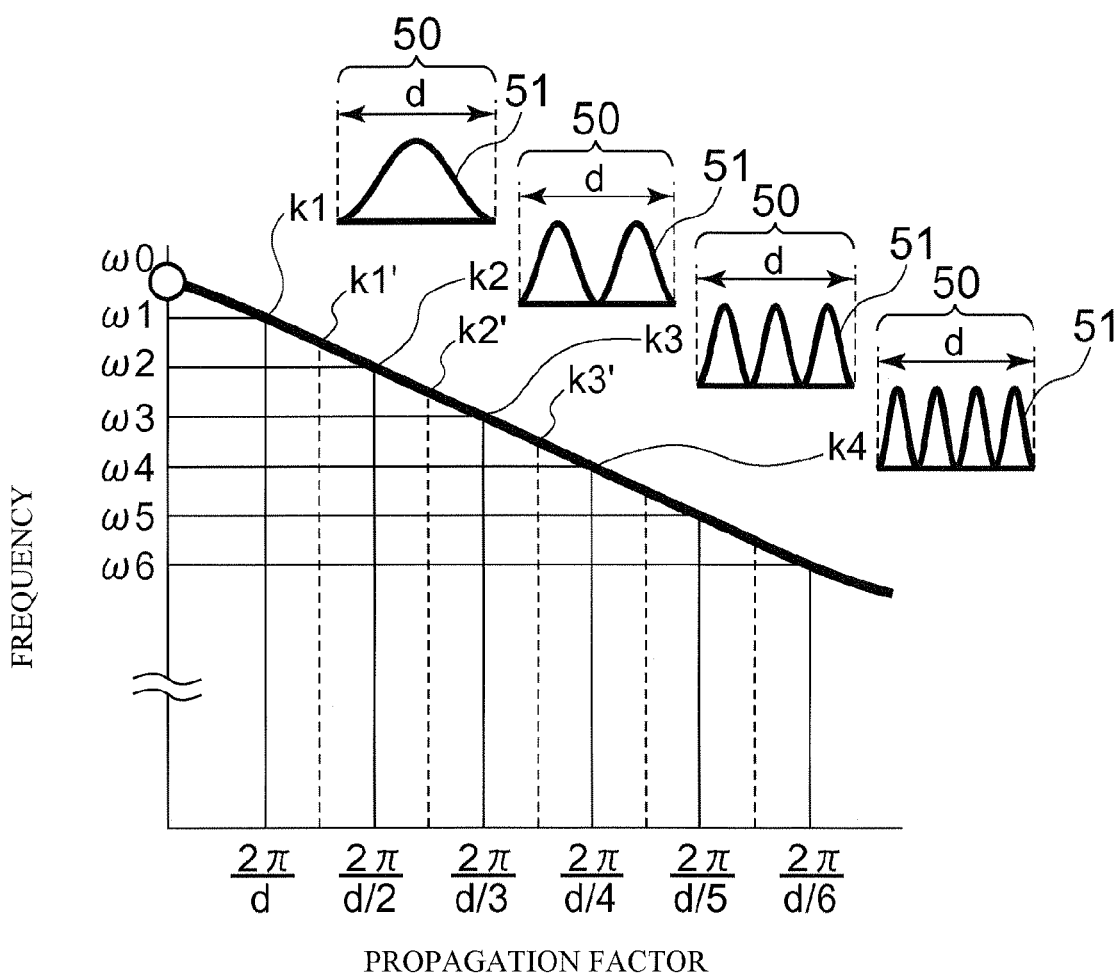
FIG. 8 illustrates an enlarged TE1 mode shown in FIG. 7.

FIG. 8 illustrates an enlarged view of the dispersion curve of the TE1 mode around the cut-off frequency shown in FIG. 7. If a width of the resonance region 50 is shown as "d", a first standing wave 51 through an n-th standing wave ("n" is a given value) are respectively generated in the resonance region 50 when the resonator is excited at frequencies $\omega 1$ through $\omega n$ at k1 through kn where the wave number k is one of $2\pi/d$ through $2\pi/(d/n)$. These standing waves 51 do not have a displacement on an end part of the resonance region 50. And, it is possible to obtain a vibration having a small loss in spite of the width of the support region 52. However, at wave numbers k1' through kn' between the wave number k1 through kn, the standing waves have a displacement on the end part of the resonance region 50. For example, a wave propagating in a lateral direction in the support region 52 is restrained, if the width L of the support region 52 corresponds to 1/4 of the wave propagating in the lateral direction. This results in a forcible restriction of amplitude of a wave at the end part of the resonance region 50. This results in a thermal loss of the acoustic waves according to the wave numbers k1' through kn' at the end part of the resonance region 50. A spurious is occurred in a frequency range according to the wave numbers k1' through kn', because of the thermal loss.

Figure 1:
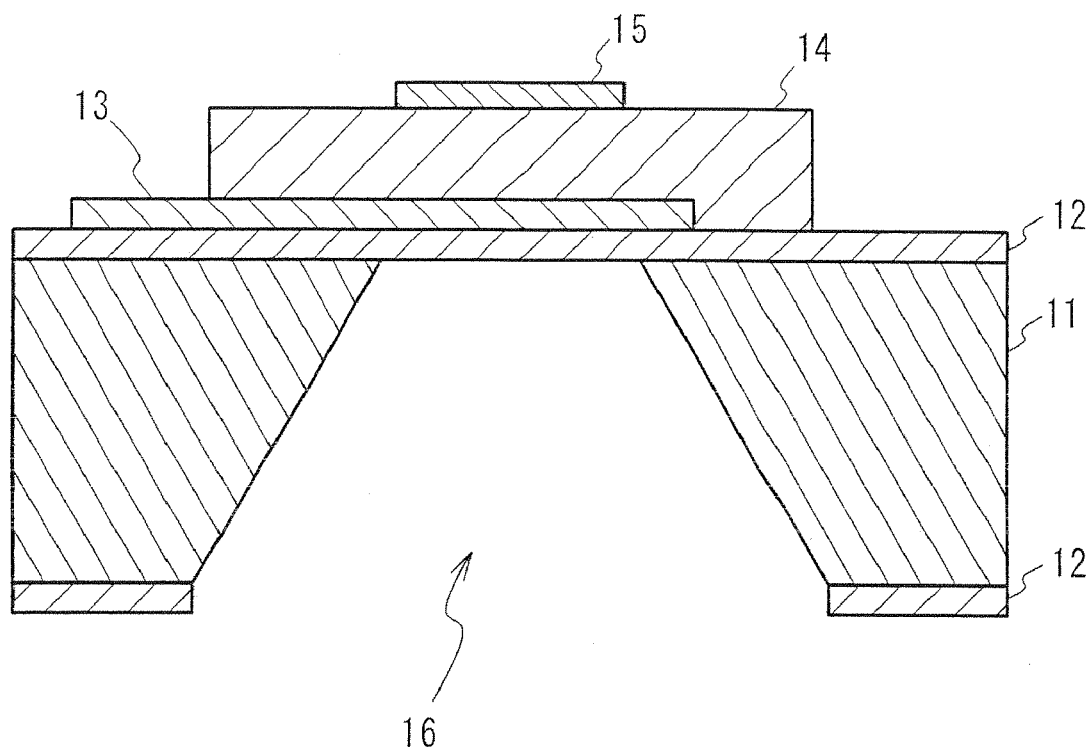
FIG. 1 illustrates a schematic cross sectional view of a film bulk acoustic resonator in accordance with a first conventional embodiment.
Figure 2:
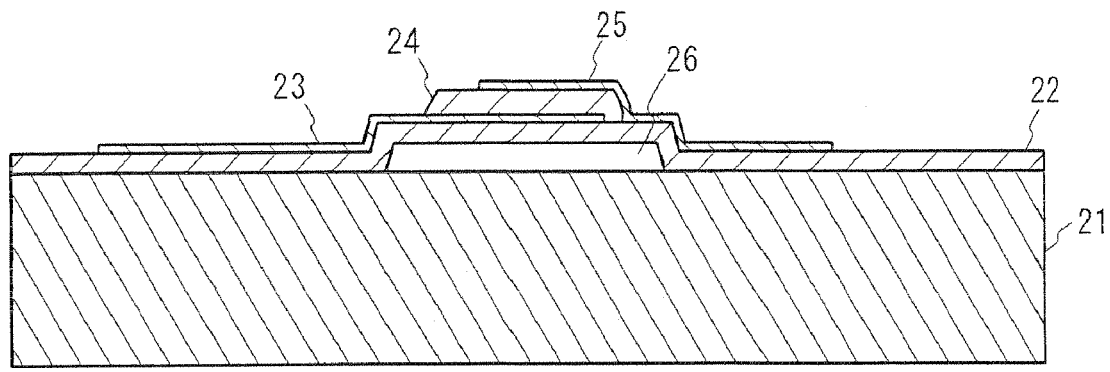
FIG. 2 illustrates a schematic cross sectional view of a film bulk acoustic resonator in accordance with a second conventional embodiment.
Figure 3:
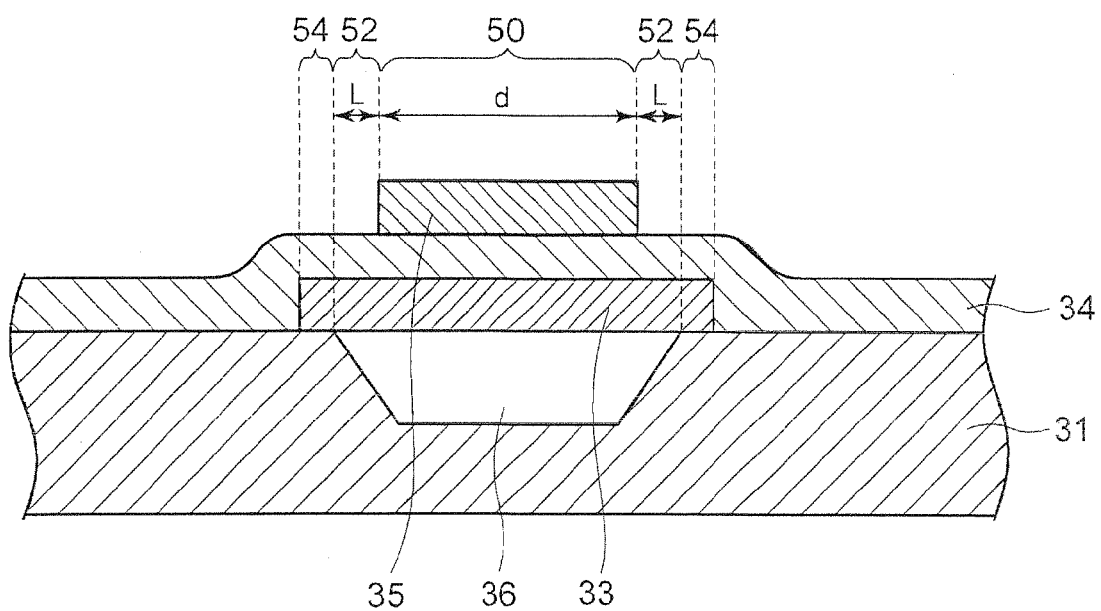
FIG. 3 illustrates a schematic cross sectional view of a film bulk acoustic resonator in accordance with a third conventional embodiment.
Figure 4:
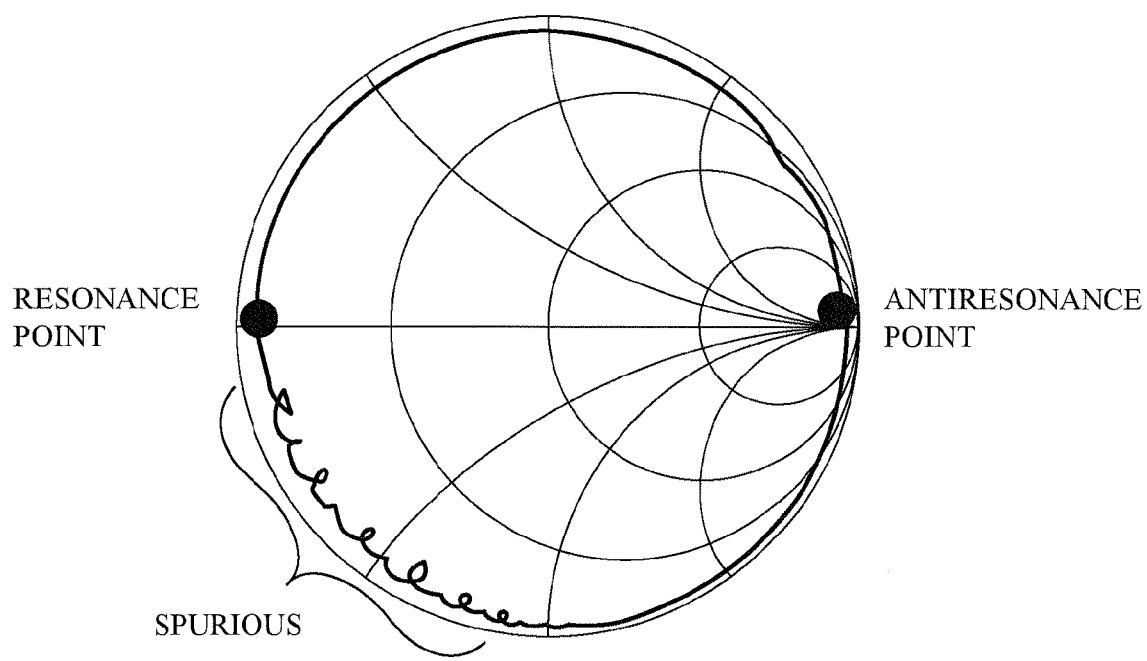
FIG. 4 illustrates a Smith chart showing S11 of a film bulk acoustic resonator having a spurious.
Figure 5:
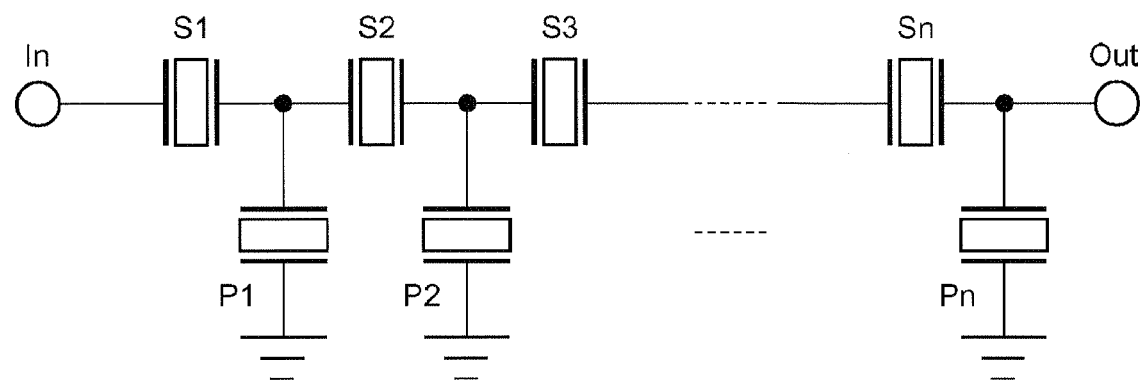
FIG. 5 illustrates a circuit diagram of a ladder type of a filter.
Figure 6:
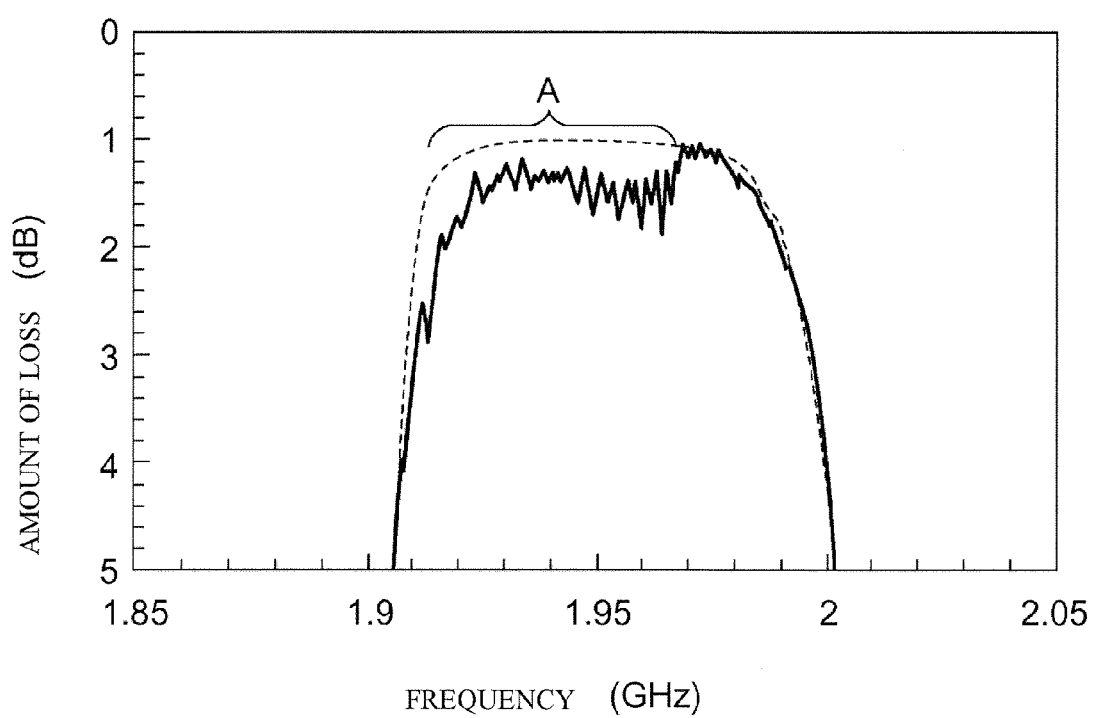
FIG. 6 illustrates a transmitting property of a filter including a film bulk acoustic resonator having a spurious.

In FIG. 3, the acoustic wave in the support region 52 is strongly excited, if the width of the support region 52 is a half of the wavelength of the acoustic wave propagating in the lateral direction. In this case, the vibration of the wave having amplitude at the end part of the resonance region 50 (acoustic waves at k1' through kn' shown in FIG. 8) is not restrained. This results in a restriction of the thermal loss and a generation of the spurious. It is possible to restrain the spurious when the width of the support region 52 is approximately a half of the wavelength $\lambda$ of the wave propagating in the lateral direction. A description will now be given, with reference to the accompanying drawings, of embodiments of the present invention.

First Embodiment

FIG. 9A illustrates a top view of a resonator in accordance with a first embodiment. FIG. 9B illustrates a cross sectional view taken along a line A-A of FIG. 9A. FIG. 9C illustrates a cross sectional view taken along a line B-B of FIG. 9A. There is formed a void 46 (a via hole) in a Si (silicon) substrate 41. There is provided a lower electrode 43 above the void 46 and on the substrate 41. There is provided a piezoelectric film 44 made of AlN on the lower electrode 43. There is provided an upper electrode 45 on the piezoelectric film 44. The resonance region 50 is a region in which the lower electrode 43 and the upper electrode 45 are facing each other through the piezoelectric film 44. The support region 52 composed of the lower electrode 43 and the piezoelectric film 44 on the void 46 is provided around the resonance region 50 except for a wiring portion 56 extracting the upper electrode 45 and the around. The adjacent region 54 composed of the substrate 21, the lower electrode 43 and the piezoelectric film 44 is provided around the support region 52 except for the wiring portion 56 extracting the upper electrode 45 and the around. The resonance region 50 and the void 46 have an ellipse shape and are analogous to each other, and the resonance region 50 is included in the void 46, when the resonance region 50 and the void 46 are viewed from upper side. The piezoelectric film 44 has an opening 47 for getting an electrical signal from the lower electrode 43.

Figure 10A:
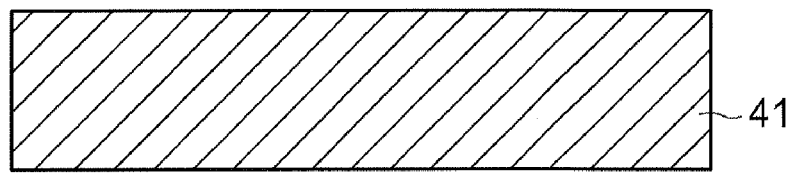
FIG. 10A through FIG. 10D illustrate a manufacturing step of the film bulk acoustic resonator in accordance with the first embodiment.
Figure 10B:
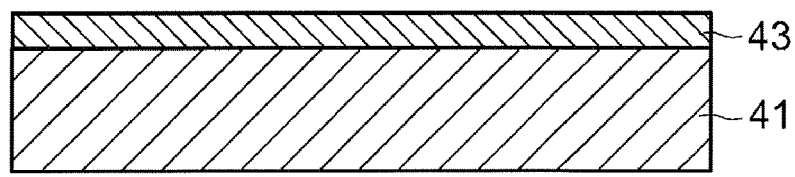
Figure 10C:
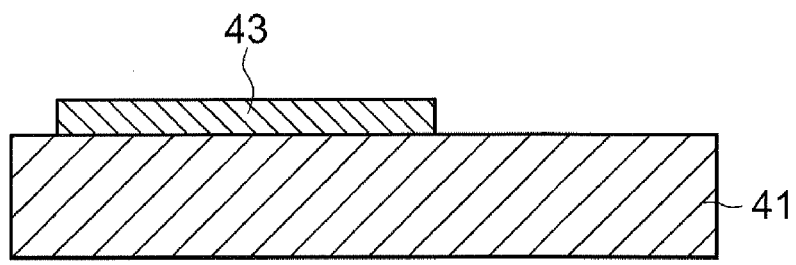
Figure 10D:
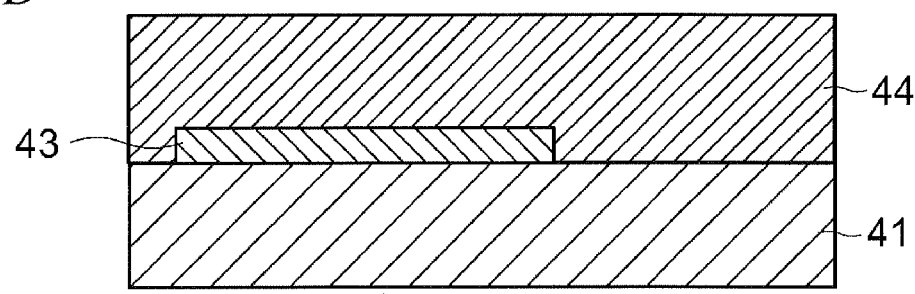

A description will be given of a manufacturing method of the resonator in accordance with the first embodiment. FIG. 10A through FIG. 11C illustrate a schematic cross sectional view corresponding to a cross sectional view taken along a line A-A of FIG. 9A showing the manufacturing method of the resonator. As shown in FIG. 10A, the substrate 41 composed of (100)-cut Si is prepared. As shown in FIG. 10B, the lower electrode 43 is formed with a sputtering method using an Ar gas atmosphere of 0.6 Pa to 1.2 Pa. The lower electrode 43 is made of Ru and has a thickness of approximately 250 nm. As shown in FIG. 10C, the lower electrode 43 is deformed to a given shape with an exposure technology and an etching technology. As shown in FIG. 10D, the piezoelectric film 44 is formed on the lower electrode 43 and on the substrate 41 with a sputtering method using Ar/N$_2$ gas mixture atmosphere of approximately 0.3 Pa. The piezoelectric film 44 is made of an AlN film having a main axis of (002) direction and has a thickness of approximately 1 μm.

Figure 11A:
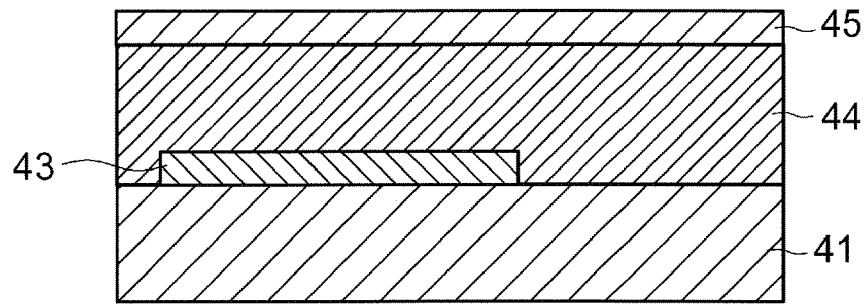
FIG. 11A through FIG. 11C illustrate the manufacturing step of the film bulk acoustic resonator in accordance with the first embodiment.
Figure 11B:
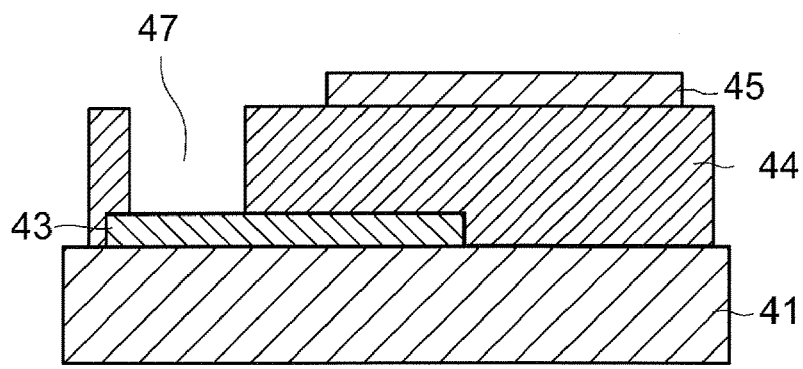
Figure 11C:
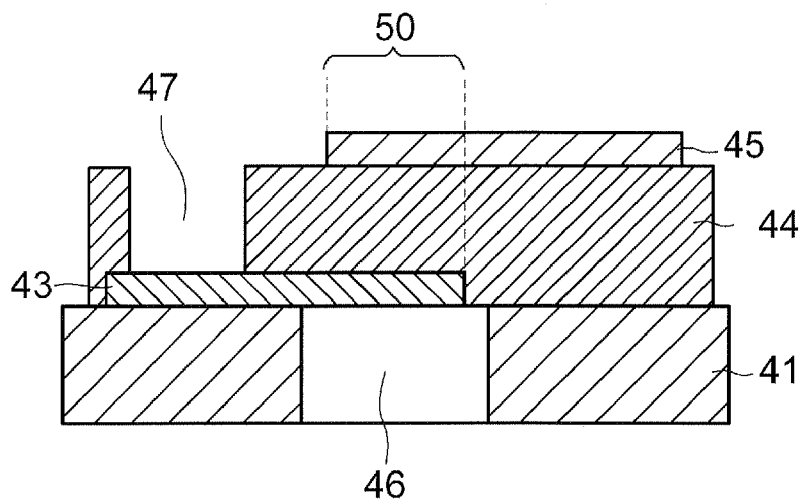

As shown in FIG. 11A, the upper electrode 45 is formed on the piezoelectric film 44 with a sputtering method using an Ar gas atmosphere of 0.6 Pa to 1.2 Pa. The upper electrode 45 is composed of Ru and has a thickness of approximately 250 nm. As shown in FIG. 11B, the upper electrode 45 is deformed to a given shape with an exposure technology and an etching technology. The piezoelectric film 44 is deformed to a given shape with an exposure technology and an etching technology. Thus, the opening 47 is formed. A region where the lower electrode 43 overlaps with the upper electrode 45 through the piezoelectric film 44 is the resonance region 50. As shown in FIG. 11C, a back face of the substrate 41 is subjected to a dry etching treatment. And the void 46 is formed in the substrate 41 so as to include the resonance region 50. With the processes, the resonator in accordance with the first embodiment is manufactured.

In FIG. 10A, the substrate 41 may be a silica substrate, a glass substrate, a GaAs substrate or the like, in addition to the Si substrate in accordance with the first embodiment. In FIG. 10B and in FIG. 11A, the lower electrode 43 and the upper electrode 45 may be made of a metal disclosed in the background of the invention other than Ru used in the first embodiment.

Figure 12:
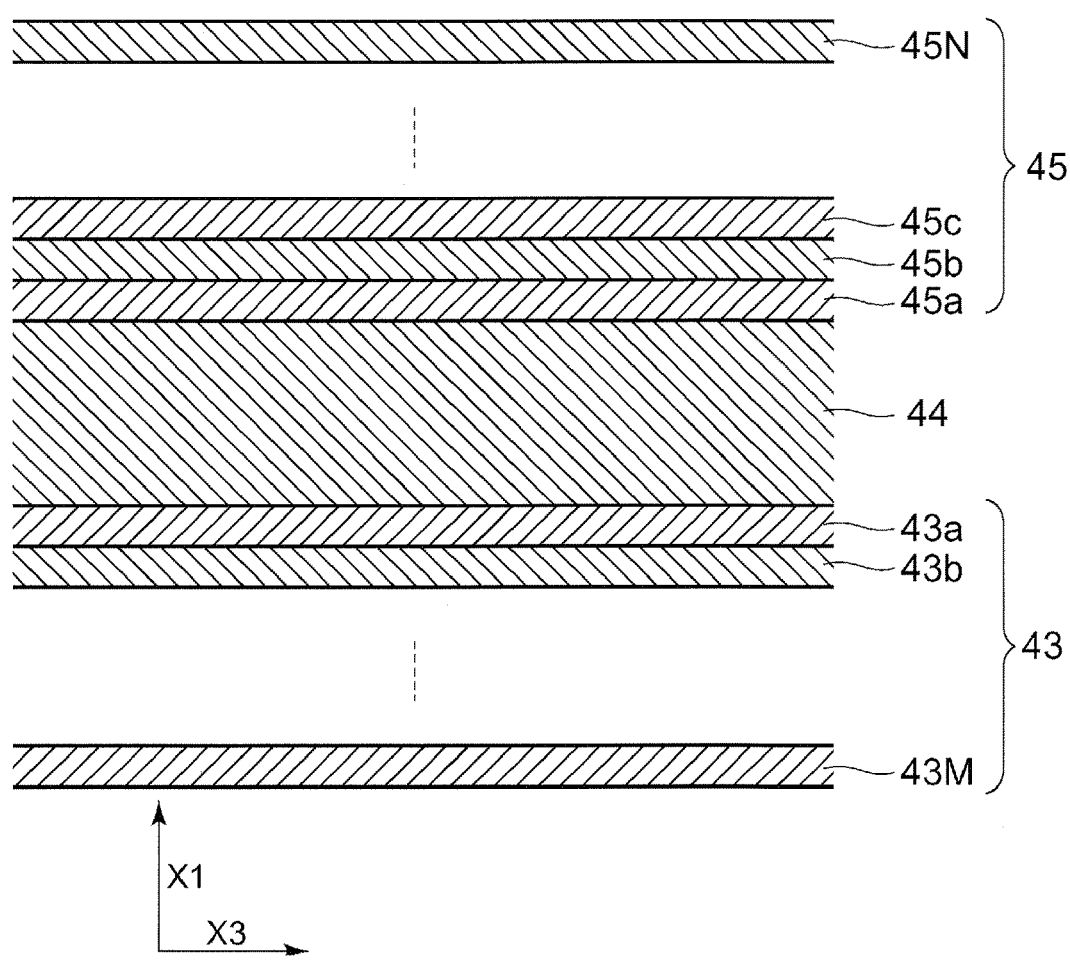
FIG. 12 illustrates a lower electrode, a piezoelectric film, and an upper electrode in a resonance region.

A dispersion property of vibration mode of an acoustic wave on the resonance region 50, the support region 52 and the adjacent region 54 in accordance with the first embodiment is calculated based on "The Journal of The Acoustical Society of America, Vol. 35, No. 2, pp. 235 to 239". FIG. 12 illustrates a laminate structure of the resonance region 50 in a case where the lower electrode 43 is a multilayer film composed of a layer 43a through layer 43M ("M" is a given value) and the upper electrode 45 is a multilayer composed of a layer 45a through 45N ("N" is a given value). It is defined that a coordinate in a lateral direction (horizontal direction of each of the layers) is "x3" and a coordinate in a longitudinal direction (lamination direction of each of the layers) is "x1". A displacement u1 in the x1 direction and a displacement u3 in the x3 direction in the piezoelectric film 44 and an electrical potential φ are obtained as a wave solution of Expressions 1 through 3, if a wave number in the x1 direction is "α", a wave number in the x3 direction is "k", and an excitation angular frequency is "ω".

$$u_1 = jA_1 e^{j(\omega t - kx_1)}(C \cos \alpha x_3 + D \sin \alpha x_3) \quad \text{(Expression 1)}$$

$$u_3 = A_3 e^{j(\omega t - kx_1)}(C \sin \alpha x_3 - D \cos \alpha x_3) \quad \text{(Expression 2)}$$

$$\phi = A_e e^{j(\omega t - kx_1)}(C \sin \alpha x_3 - D \cos \alpha x_3) \quad \text{(Expression 3)}$$

Here, A1, A3, Ae, C and D are a given constant.

Expression 4 is obtained if Expressions 1 through 3 are substituted into a motion equation and a charge equation.

$$\begin{pmatrix} c_{11}^E k^2 + c_{44}^E \alpha^2 - \rho \omega^2 & (c_{13}^E + c_{44}^E)k\alpha & (e_{31} + e_{15})k\alpha \\ (c_{13}^E + c_{44}^E)k\alpha & c_{44}^E k^2 + c_{33}^E \alpha^2 - \rho \omega^2 & e_{15}k^2 + e_{33}\alpha^2 \\ (e_{31} + e_{15})k\alpha & e_{15}k^2 + e_{31}\alpha^2 & -(\varepsilon_{11}^S k^2 + \varepsilon_{33}^S \alpha^2) \end{pmatrix} \begin{pmatrix} A_1 \\ A_3 \\ A_e \end{pmatrix} = 0$$

(Expression 4)

Here, the piezoelectric material is 6 mm hexagonal system. "ρ" is a density of the piezoelectric film 44. "$c_{11}$", "$c_{13}$", "$c_{33}$" and "$c_{44}$" are a stiffness of the piezoelectric film 44. "$e_{15}$", "$e_{31}$" and "$e_{33}$" are a piezoelectric coefficient if the piezoelectric film 44. "$\varepsilon_{11}$", and "$\varepsilon_{33}$" are a permittivity. "S" is a distortion. "E" is an electrical field.

A determinant of coefficient matrix of Expression 4 must be zero in order that Expression 4 has a solution other than a trivial solution. If "ω" and "k" are given, Expression 4 is a third degree equation of $\alpha^2$. This results in that three basic solutions are obtained from Expression 4. Expressions 1 through 3 are shown as a linear sum of the three solutions shown as Expressions 5 through 7.

$$u_1 = je^{j(\omega t - kx_1)} \sum_{i=1}^{3} A_1^{(i)}(C^{(i)}\cos\alpha^{(i)}x_3 + D^{(i)}\sin\alpha^{(i)}x_3) \quad \text{(Expression 5)}$$

$$u_3 = e^{j(\omega t - kx_1)} \sum_{i=1}^{3} A_3^{(i)}(C^{(i)}\sin\alpha^{(i)}x_3 - D^{(i)}\cos\alpha^{(i)}x_3) \quad \text{(Expression 6)}$$

$$\phi = e^{j(\omega t - kx_1)} \sum_{i=1}^{3} A_e^{(i)}(C^{(i)}\sin\alpha^{(i)}x_3 - D^{(i)}\cos\alpha^{(i)}x_3) \quad \text{(Expression 7)}$$

Similarly, an acoustic wave in the n-th layer 45n of the upper electrode 45 is shown as Expressions 8 and 9.

$$u_{1un} = jA_{1un}e^{j(\omega t - kx_1)}(C_{un} \cos \alpha_{un}x_3 + D_{un} \sin \alpha_{un}x_3) \quad \text{(Expression 8)}$$

$$u_{3un} = A_{3un}e^{j(\omega t - kx_1)}(C_{un} \sin \alpha_{un}x_3 - D_{un} \cos \alpha x_3) \quad \text{(Expression 9)}$$

Here, "$A_{1un}$", "$A_{3un}$", "$C_{un}$" and "$D_{un}$" are a given constant.

If Expressions 8 and 9 are substituted into the motion equation, a simultaneous equation shown as Expression 10 is obtained.

$$\begin{pmatrix} (\lambda_{un} + 2\mu_{un})k^2 + \mu_{un}\alpha_{un}^2 - \rho_{un}\omega^2 & (\lambda_{un} + \mu_{un})k\alpha_{un} \\ (\lambda_{un} + \mu_{un})k\alpha_{un} & \mu_{un}k^2 + (\lambda_{un} + 2\mu_{un})\alpha^2 - \rho_{un}\omega^2 \end{pmatrix}$$
$$\begin{pmatrix} A_{1un} \\ A_{3un} \end{pmatrix} = 0$$

(Expression 10)

Here, the upper electrode 45 is made of an isotropic material. "$\lambda_{un}$" and "$\mu_{un}$" are a constant of a lame used for the n-th layer 45n of the upper electrode 45. "$\rho_{un}$" is a density of a material used for the n-th layer 45n of the upper electrode 45.

A determinant of coefficient matrix of Expression 10 must be zero in order that Expression 10 has a solution other than a trivial solution. Therefore, Expression 10 is a second degree equation of $\alpha^2$. This results in that two basic solutions are obtained from Expression 10. Expressions 8 and 9 may be shown as Expressions 11 and 12.

$$u_{1un} = je^{j(\omega t - kx_1)} \sum_{i=1}^{2} A_{1un}^{(i)} (C_{un}^{(i)} \cos\alpha_{un}^{(i)} x_3 + D_{un}^{(i)} \sin\alpha_{un}^{(i)} x_3)$$ (Expression 11)

$$u_{3un} = e^{j(\omega t - kx_1)} \sum_{i=1}^{2} A_{3un}^{(i)} (C_{un}^{(i)} \sin\alpha_{un}^{(i)} x_3 - D_{un}^{(i)} \cos\alpha_{un}^{(i)} x_3)$$ (Expression 12)

A wave solution in the m-th layer 43m of the lower electrode 43 may be obtained, as well as the upper electrode 45. Therefore, the wave solution may be shown as Expressions 13 and 14.

$$u_{1bm} = je^{j(\omega t - kx_1)} \sum_{i=1}^{2} A_{1bm}^{(i)} (C_{bm}^{(i)} \cos\alpha_{bm}^{(i)} x_3 + D_{bm}^{(i)} \sin\alpha_{bm}^{(i)} x_3)$$ (Expression 13)

$$u_{3bm} = e^{j(\omega t - kx_1)} \sum_{i=1}^{2} A_{3bm}^{(i)} (C_{bm}^{(i)} \sin\alpha_{bm}^{(i)} x_3 - D_{bm}^{(i)} \cos\alpha_{bm}^{(i)} x_3)$$ (Expression 14)

Here, "$A_{1bm}$", "$A_{3bm}$", "$C_{bm}$" and "$D_{bm}$" are a given constant.

An interface condition is described below. A lateral displacement, a longitudinal displacement, a vertical stress and a shear stress are continuous. An electrical potential is zero at an interface between the piezoelectric film 44 and the upper electrode 45 and between the piezoelectric film 44 and the lower electrode 43. A vertical stress and a shear stress are zero at the surface of the upper electrode 45 and the surface of the lower electrode 43. (4N+4M+6)-th degree equation is obtained, if the wave solutions of Expressions 5 through 7 and Expressions 11 through 14 are substituted into the interface condition. Further, a continuation of electrical displacement vertical to an interface between the piezoelectric film 44 and the upper electrode 45 or the lower electrode 43 (that is a surface where at least one of the lower electrode 43 and the upper electrode 45 is not formed) and a continuation of electrical field displacement in parallel to the interface are the interface condition, in a case where the surface of the piezoelectric film 44 is an interface not covered with at least one of the upper electrode 45 and the lower electrode 43 (that is a case where N=0 or M=0). Thus, the simultaneous equation is (4N+4M+8)-th degree. And Expression 15 is obtained.

(Expression 15)

$$\begin{pmatrix} B_{11} & \cdots & B_{1j} & \cdots & B_{1(4N+4M-6)} \\ \vdots & \ddots & & \iddots & \vdots \\ B_{i1} & & B_{ij} & & B_{i(4N+4M6)} \\ \vdots & \iddots & & \ddots & \vdots \\ B_{(4N+4M+6)1} & \cdots & B_{(4N+4M+6)j} & \cdots & B_{(4N+4M+6)(4N+4M+6)} \end{pmatrix} \begin{pmatrix} C_{uN}^{(1)} \\ D_{uN}^{(1)} \\ C_{uN}^{(2)} \\ D_{uN}^{(2)} \\ \vdots \\ C_{bM}^{(1)} \\ D_{bM}^{(1)} \\ C_{bM}^{(2)} \\ D_{bM}^{(2)} \end{pmatrix}$$

A determinant |B| of coefficient matrix B of Expression 15 is zero, if "$\omega$" and "k" are a value of a point on a dispersion curve. And so, a point ($\omega$, k) is numerically extracted in calculations below, when "|B|=0" is used as a discriminant.

Figure 13:
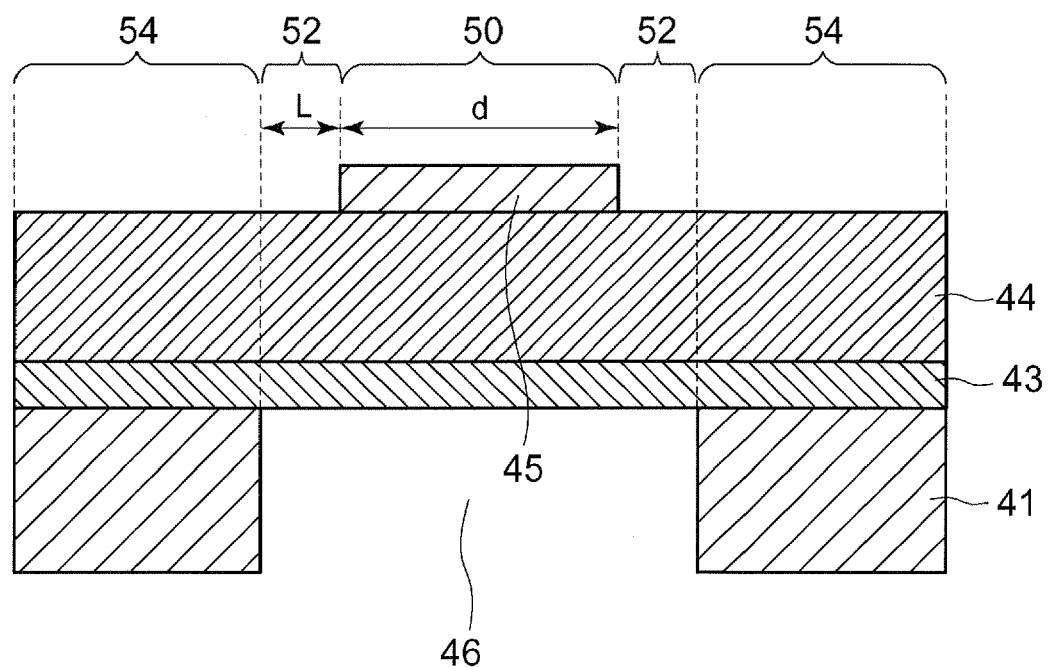
FIG. 13 illustrates a schematic cross sectional view of the film bulk acoustic resonator in accordance with the first embodiment.

FIG. 13 illustrates a schematic view of a structure obtained with a calculation of the dispersion property of the resonator in accordance with the first embodiment, and corresponds to FIG. 9C. In the resonance region 50, the lower electrode 43 faces the upper electrode 45 through the piezoelectric film 44. The support region 52 is provided around the resonance region 50, and is composed of the lower electrode 43 and the piezoelectric film 44 on the void 46. The adjacent region 54 is provided around the support region 52, and is composed of the substrate 41, the lower electrode 43 and the piezoelectric film 44. A width of the resonance region 50 in a lateral direction is shown as "d". A width of the support region 52 in a lateral direction is shown as "L".

FIG. 14A through FIG. 14C illustrate a calculation result of the dispersion property of the vibration mode of the acoustic wave on the resonance region 50, on the support region 52 and on the adjacent region 54, and show the dispersion property of the vibration of the acoustic wave. A vertical axis indicates an excitation frequency. A horizontal axis indicates a propagation coefficient of a vibration of each vibration motion in a lateral direction with use of a wave number k. The horizontal axis shows two quadrants. The right quadrant shows a real number region. The left quadrant shows an imaginary number region. A frequency $\omega 0$ indicates a resonance frequency. The propagation coefficient of the vibration mode shows that an acoustic wave at a frequency in the real number region propagates or is scattered, and shows that an acoustic wave at a frequency in the imaginary number region is reflected, does not propagate and is not scattered. As shown in FIG. 14B, an acoustic wave propagating in a lateral direction in the support region 52 has the wave number $k_L$ of the resonance frequency $\omega 0$. Therefore, a wavelength of the acoustic wave propagating in the lateral direction in the support region 52 is $1/K_L$.

FIG. 15A through FIG. 15C respectively illustrate a schematic view of the calculation results of the dispersion property shown in FIG. 14A through FIG. 14C. FIG. 15A illustrates a dispersion curve of TE1 mode of a thickness longitudinal vibration that is a main mode in the resonance region 50 with a solid line. A dotted line shows dispersion curves of the other modes. A frequency at a point A is approximately the resonance frequency $\omega 0$. The point A is a point where the dispersion curve of the TE1 mode crosses the frequency axis. A frequency range between the resonance frequency ω0 and a frequency ω'0 of a local minimum point B of the dispersion curve of the TE1 mode is a frequency range where a spurious is generated. As shown in FIG. 15B, in the support region 52, a point A' and a point B' of the dispersion curve of the TE1 mode at the frequency ω0 and ω'0 is in the real number region. Therefore, an acoustic wave between the frequency ω0 and the frequency ω'0 passes through the support region 52. As shown in FIG. 15C, in the adjacent region 54, a point A" and a point B" of the dispersion curve of the TE1 mode at the frequency ω0 and ω'0 is in the imaginary number region. Therefore, the acoustic wave passing through the support region 52 is blocked and is reflected at the adjacent region 54. In the first embodiment, the acoustic wave propagating in the lateral direction at the support region 52 passes through the support region 52, and the acoustic wave propagating in the lateral direction at the adjacent region 54 is blocked at the adjacent region 54.

Figure 16A:
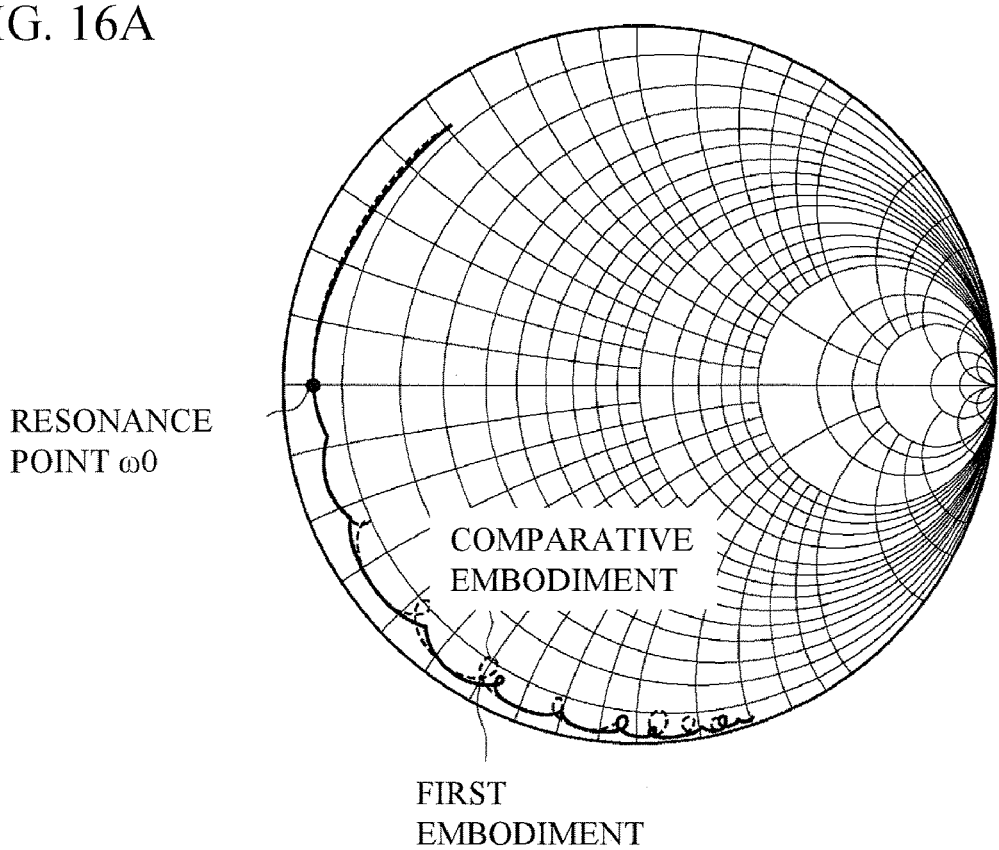
FIG. 16A illustrates a Smith chart of S11 on the first embodiment and a comparative embodiment.
Figure 16B:
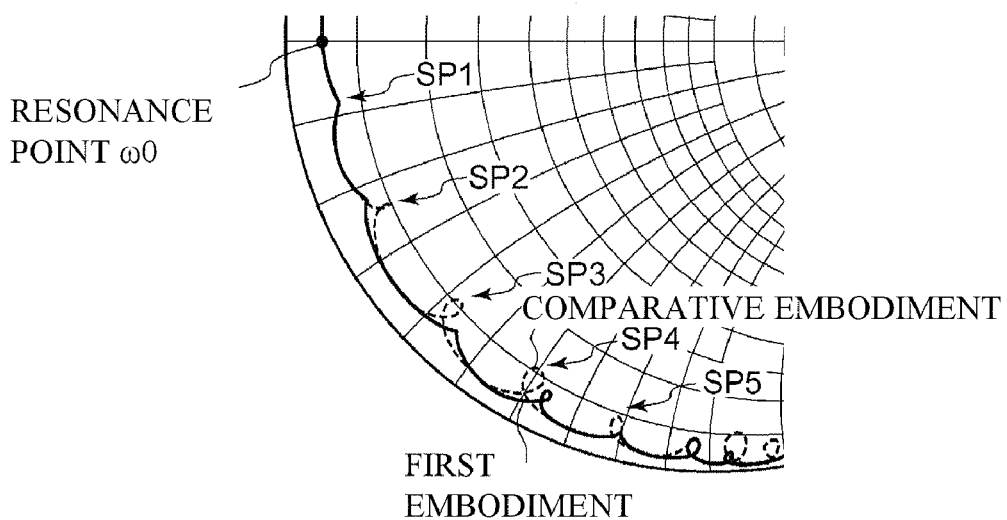
FIG. 16B illustrates an enlarged view of FIG. 16A.
Figure 17A:
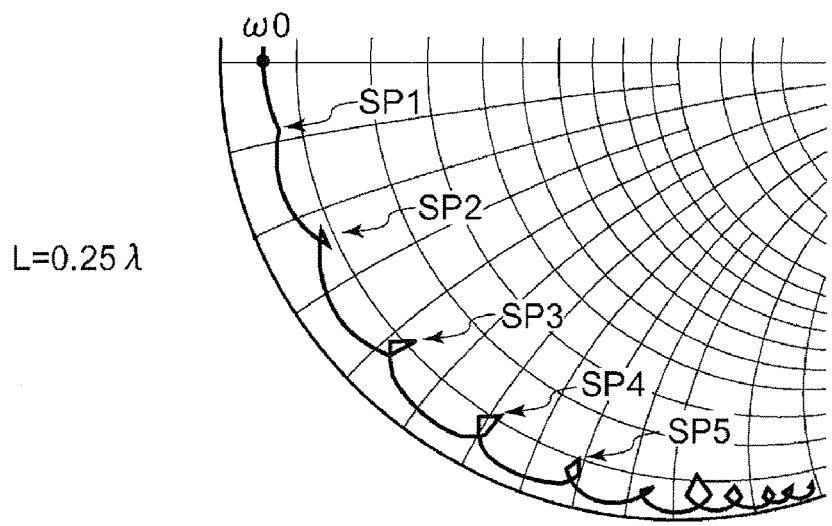
FIG. 17A through FIG. 17C illustrate the Smith chart of S11 when a width of the resonance region is changed.
Figure 17B:
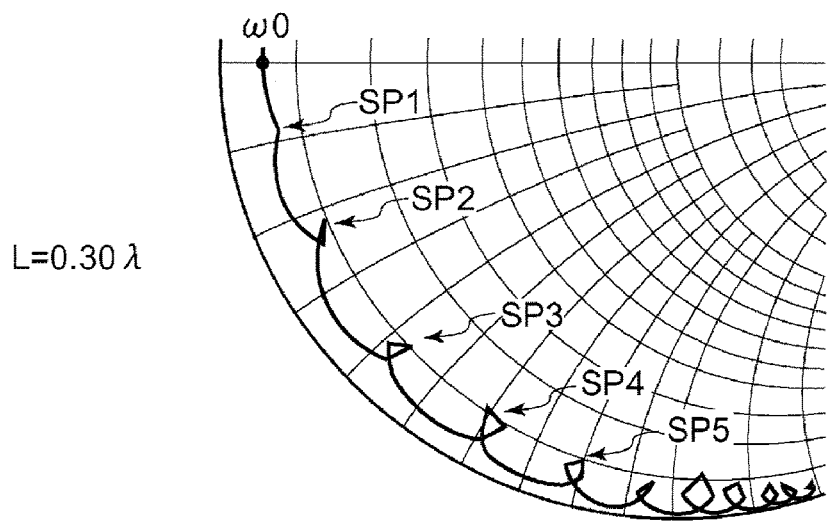
Figure 17C:
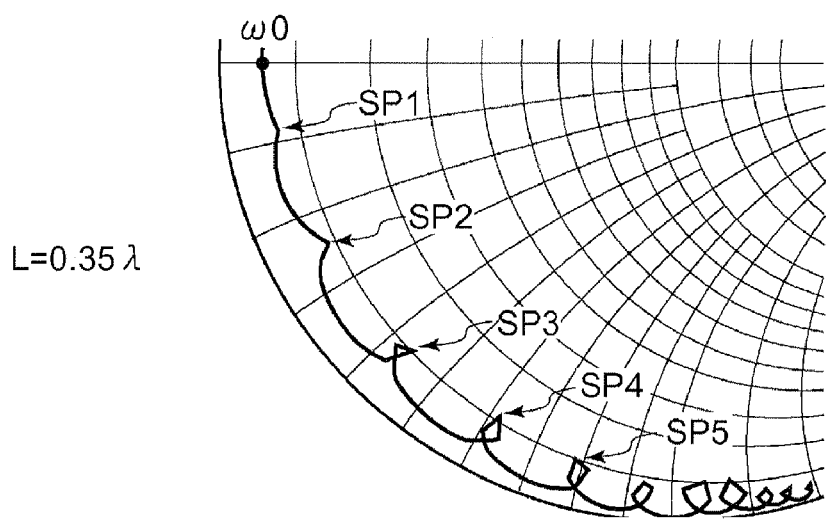
Figure 18A:
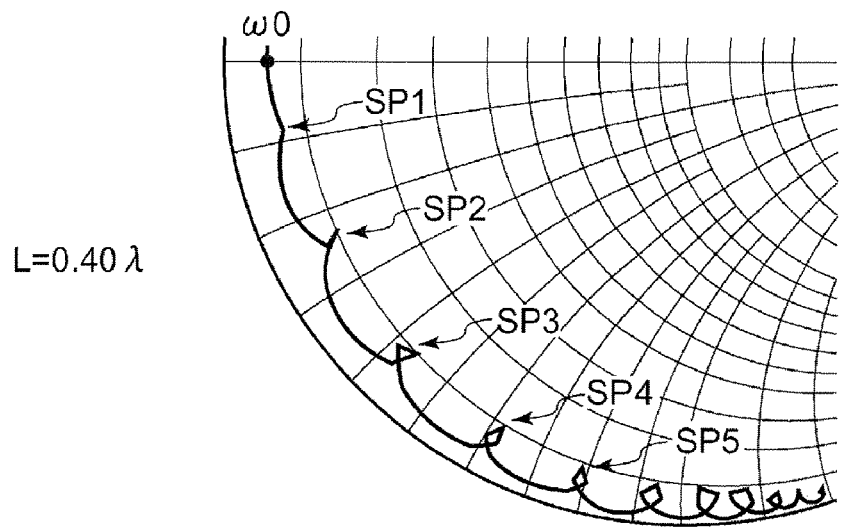
FIG. 18A through FIG. 18C illustrate the Smith chart of S11 when the width of the resonance region is changed.
Figure 18B:
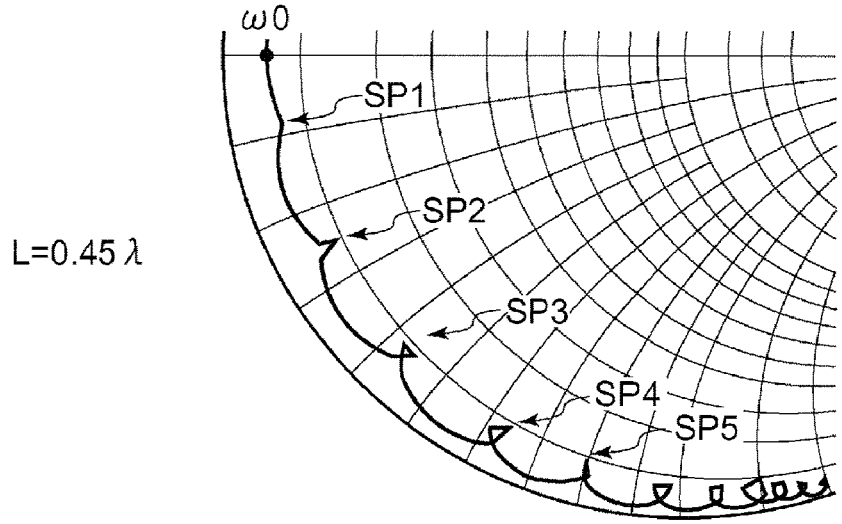
Figure 18C:
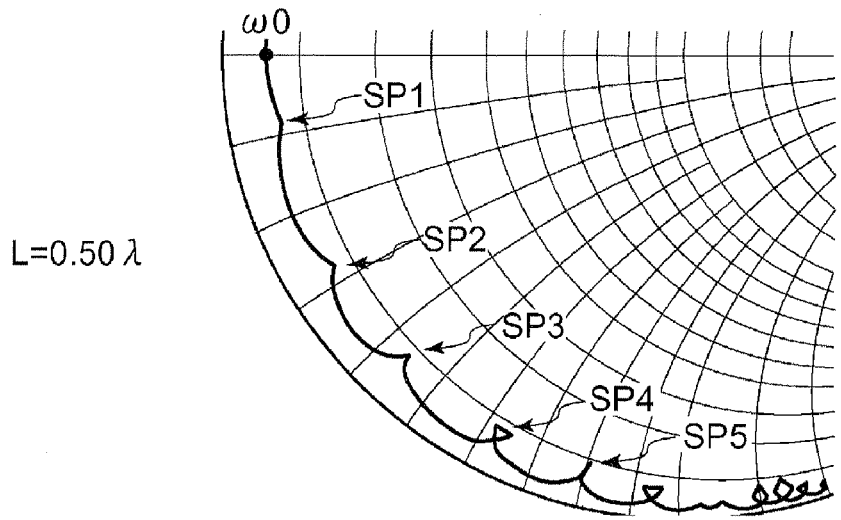
Figure 19A:
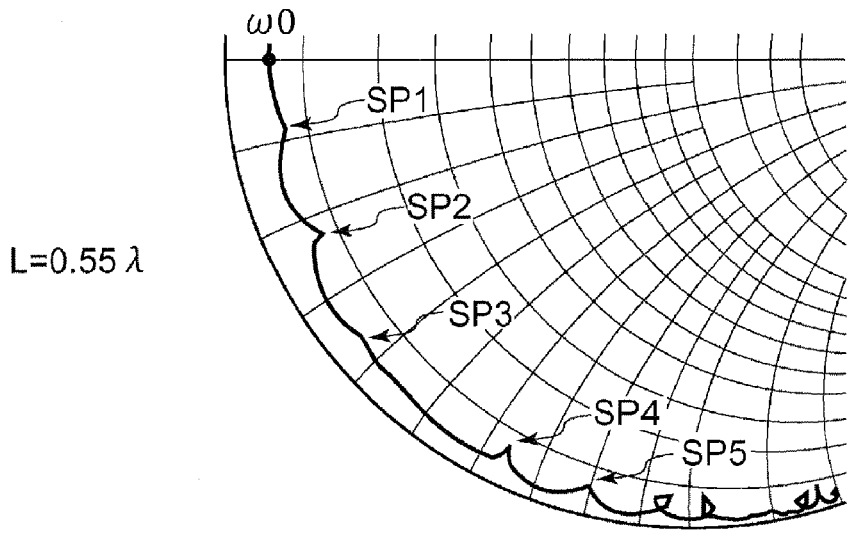
FIG. 19A through FIG. 19C illustrate the Smith chart of S11 when the width of the resonance region is changed.
Figure 19B:
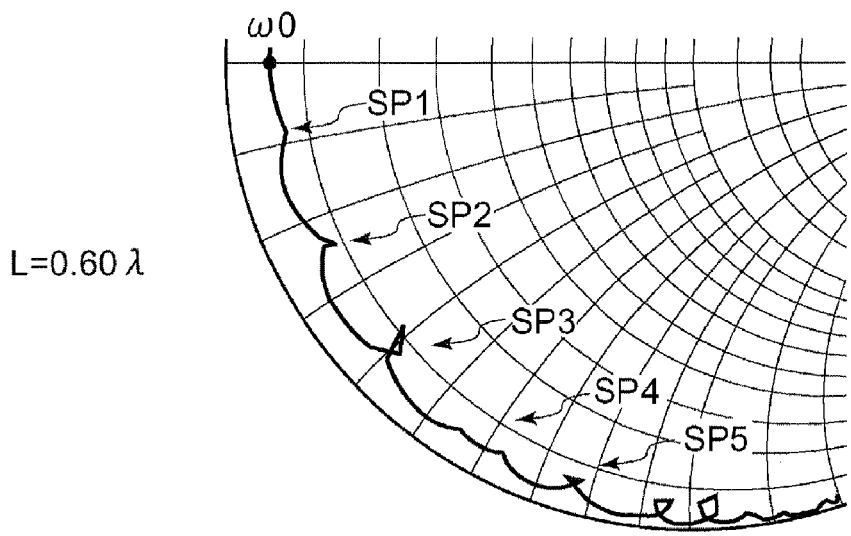
Figure 19C:
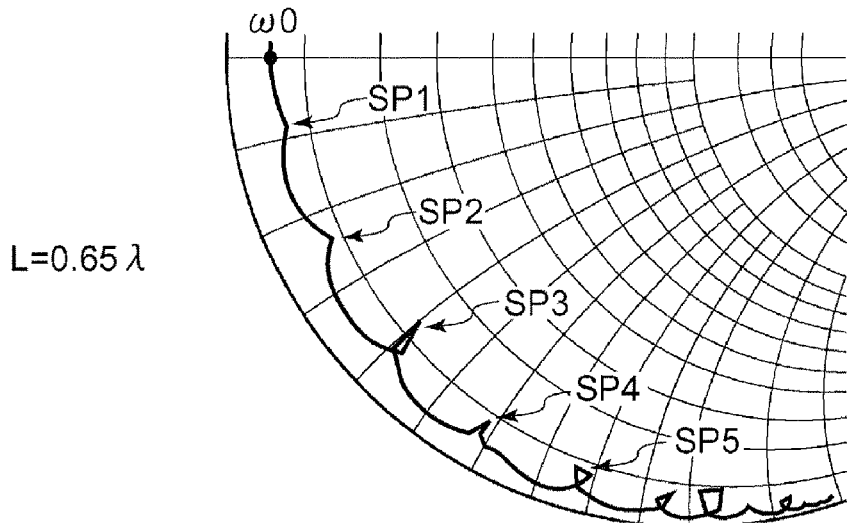
Figure 20A:
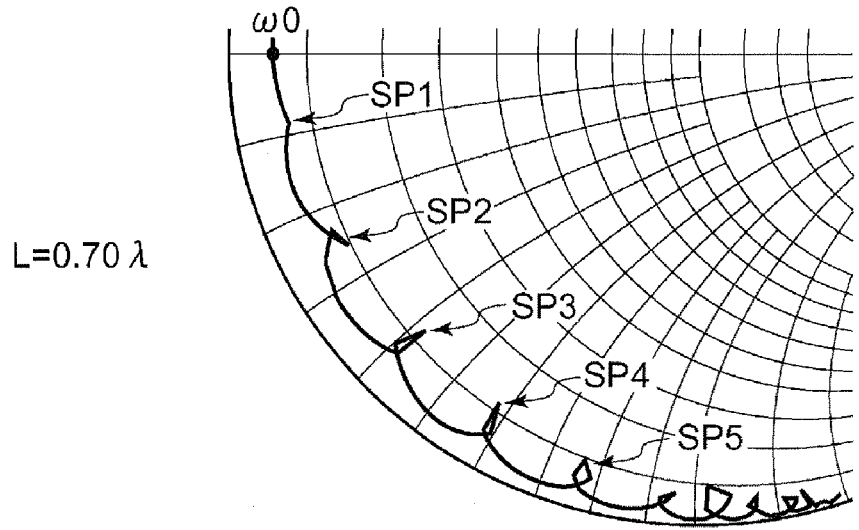
FIG. 20A and FIG. 20B illustrate the Smith chart of S11 when the width of the resonance region is changed.
Figure 20B:
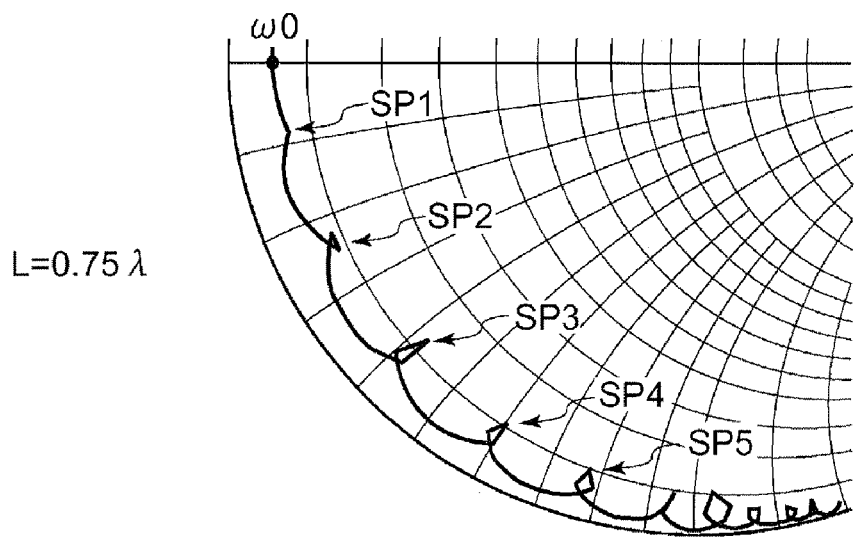

FIG. 16A and FIG. 16B illustrate a smith chart of S11 of the comparative embodiment and the first embodiment. FIG. 16B illustrates an enlarged view of FIG. 16A. A dotted line is of the comparative embodiment. A solid line is of the first embodiment. In the comparative embodiment, the width L of the support region 52 is ¼ of a wavelength λ of a wave in a lateral direction (a wave having the frequency ω0). In the first embodiment, the width L of the support region 52 is ½ of the wavelength λ. Spurious SP1 through spurious SP5 are observed on the lower frequency side with respect to the resonance point ω0. The spurious is restrained in the first embodiment, compared to the comparative embodiment. The spurious is restrained when the width d of the support region 52 is ½λ.

FIG. 17A through FIG. 20B illustrate a smith chart of S11 of the resonator in a case where the width d of the support region 52 is changed from 0.25λ to 0.75λ at every 0.05λ. S11 has a loop shape from SP2 to SP5 at L=0.25λ, in FIG. 17A. In FIG. 17C through FIG. 19C (L=0.35λ to 0.65λ), a spurious having a loop shape is hardly observed. In FIG. 18A through FIG. 19B (L=0.40λ to 0.60λ), the loop-shaped spurious is smaller than that of FIG. 17A (L=0.25λ). Further, in FIG. 18B through FIG. 19A (L=0.45λ to 0.55λ), the loop-shaped spurious is hardly observed.

The width L of the support region 52 is, preferably, more than 0.35 times the wavelength λ of a wave propagating in the lateral direction and less than 0.65 times the wavelength λ and is, more preferably, more than 0.4 times the wavelength λ and less than 0.60 times the wavelength λ, in order to restrain the spurious. Further the width L is, more preferably, more than 0.45 times the wavelength λ and less than 0.55 times the wavelength λ.

In the first embodiment, the support region 52 is composed of the lower electrode 43 and the piezoelectric film 44 on the void 46. The adjacent region 54 is composed of the lower electrode 43 and the piezoelectric film 44 on the substrate 41. The support region 52 is not particularly limited, if the support region 52 is provided around the resonance region 50 and transmits the wave propagating in the lateral direction as shown in FIG. 15B. The adjacent region 54 is not particularly limited, if the adjacent region 54 is provided around the support region 52 and blocks the wave propagating in the lateral direction as shown in FIG. 15C. A description will be given of another example of the support region 52 and the adjacent region 54.

Second Embodiment

Figure 21:
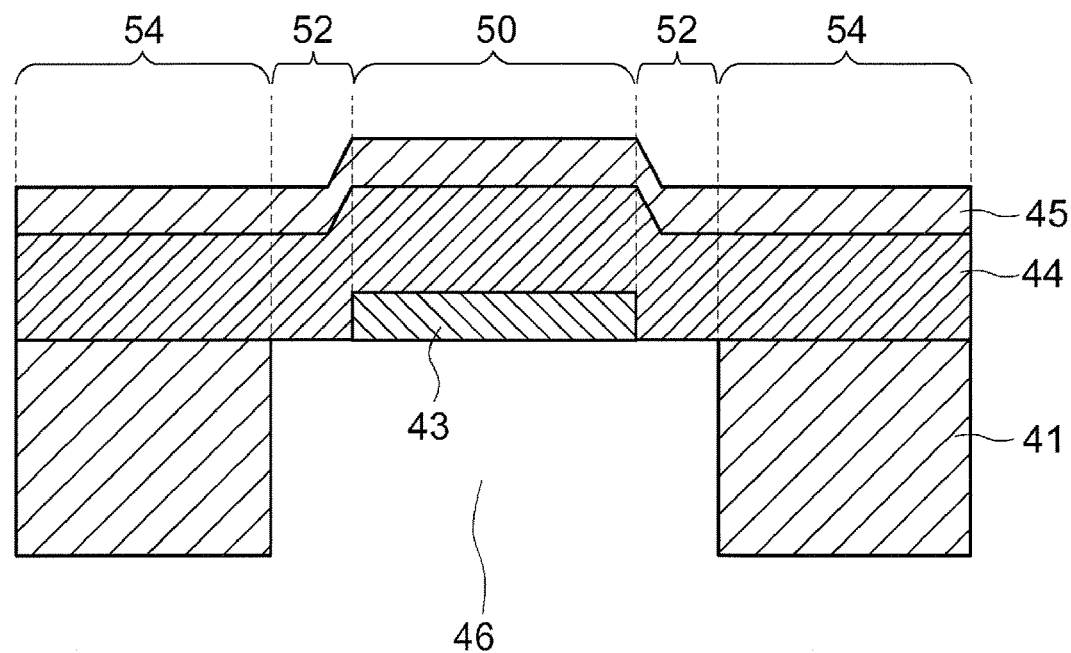
FIG. 21 illustrates a schematic cross sectional view of a film bulk acoustic resonator in accordance with a second embodiment.

FIG. 21 illustrates a schematic cross sectional view of a resonator in accordance with a second embodiment. As shown in FIG. 21, the support region 52 is composed of the piezoelectric film 44 and the upper electrode 45 on the void 46. The adjacent region 54 is composed of the substrate 41, the piezoelectric film 44 and the upper electrode 45. The void 46 is formed in the resonance region 50 and in the support region 52. The lower electrode 43 is formed in the resonance region 50. The piezoelectric film 44 and the upper electrode 45 are formed in the resonance region 50, the support region 52 and the adjacent region 54. The other structure is the same as the first embodiment shown in FIG. 13.

FIG. 22A through FIG. 22C illustrate a schematic view of the calculated dispersion property of the resonance region 50, the support region 52 and the adjacent region 54 in the resonator in accordance with the second embodiment. FIG. 22A corresponds to FIG. 15A. As shown in FIG. 22B, in the support region 52, the dispersion curve of the TE1 mode is in the real number region at a frequency between the ω0 and the ω'0 where the spurious is generated. Therefore, a wave propagating in the lateral direction passes through the support region 52. As shown in FIG. 22C, in the adjacent region 54, the dispersion curve of the TE1 mode is in the imaginary number region at a frequency between the ω0 and the ω'0. Therefore, a wave propagating in the lateral direction is reflected at the adjacent region 54.

In the structure in accordance with the second embodiment, the spurious is restrained when the width L of the support region 52 is more than 0.35 times the wavelength λ of the wave propagating in the lateral direction and less than 0.65 times the wavelength λ.

Third Embodiment

Figure 23:
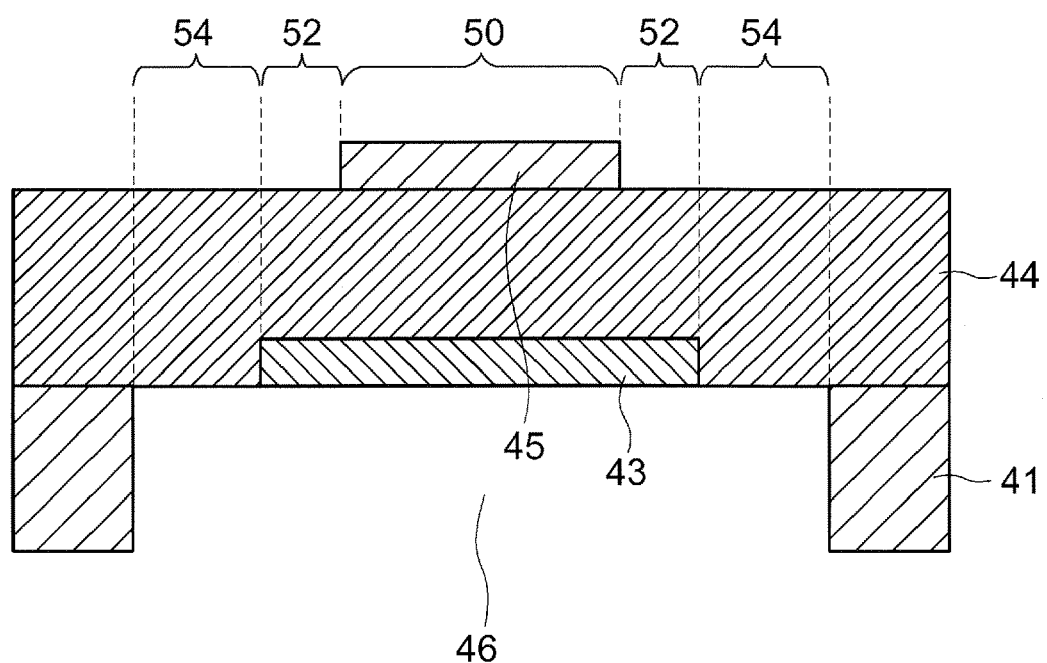
FIG. 23 illustrates a schematic cross sectional view of a film bulk acoustic resonator in accordance with a third embodiment.

FIG. 23 illustrates a schematic cross sectional view of a resonator in accordance with a third embodiment. As shown in FIG. 23, the support region 52 is composed of the lower electrode 43 and the piezoelectric film 44 on the void 46. The adjacent region 54 is composed of the piezoelectric film 44 on the void 46. The void 46 and the piezoelectric film 44 are formed on the resonance region 50, on the support region 52, and on the adjacent region 54. The lower electrode 43 is formed on the resonance region 50 and the support region 52. The upper electrode 45 is formed on the resonance region 50. The other structure is the same as that of the first embodiment shown in FIG. 13.

Figures 24A, 24B, 24C:
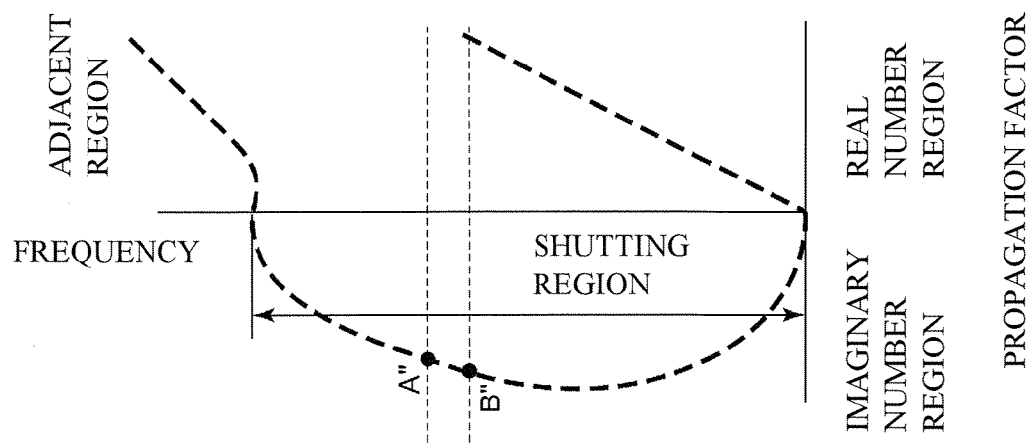
FIG. 24A through FIG. 24C illustrate a schematic view of a dispersion property of the film bulk acoustic resonator in accordance with the third embodiment.

FIG. 24A through FIG. 24C illustrate a schematic view of the calculated dispersion property of the resonance region 50, the support region 52 and the adjacent region 54 in the resonator in accordance with the third embodiment. FIG. 24A corresponds to FIG. 15A. As shown in FIG. 24B, in the support region 52, the dispersion curve of the TE1 mode is in the real number region at a frequency between the ω0 and the ω'0 where the spurious is generated. Therefore, a wave propagating in the lateral direction passes through the support region 52. As shown in FIG. 24C, in the adjacent region 54, the dispersion curve of the TE1 mode is in the imaginary number region at the frequency between the ω0 and the ω'0. Therefore, a wave propagating in the lateral direction is reflected at the adjacent region 54.

In the structure in accordance with the third embodiment, the spurious is restrained when the width L of the support region 52 is more than 0.35 times the wavelength λ of the wave propagating in the lateral direction and less than 0.65 times the wavelength λ.

In the third embodiment, the support region 52 is composed of the lower electrode 43 and the piezoelectric film 44 on the void 46, and the adjacent region 54 is composed of the piezoelectric film 44 on the void 46. The support region 52 may be composed of the upper electrode 45 and the piezoelectric film 44 on the void 46, and the adjacent region 54 may be composed of the piezoelectric film 44 on the void 46. That is, the support region 52 may be composed of the piezoelectric film 44 and one of the lower electrode 43 and the upper electrode 45 on the void 46.

Fourth Embodiment

Figure 25:
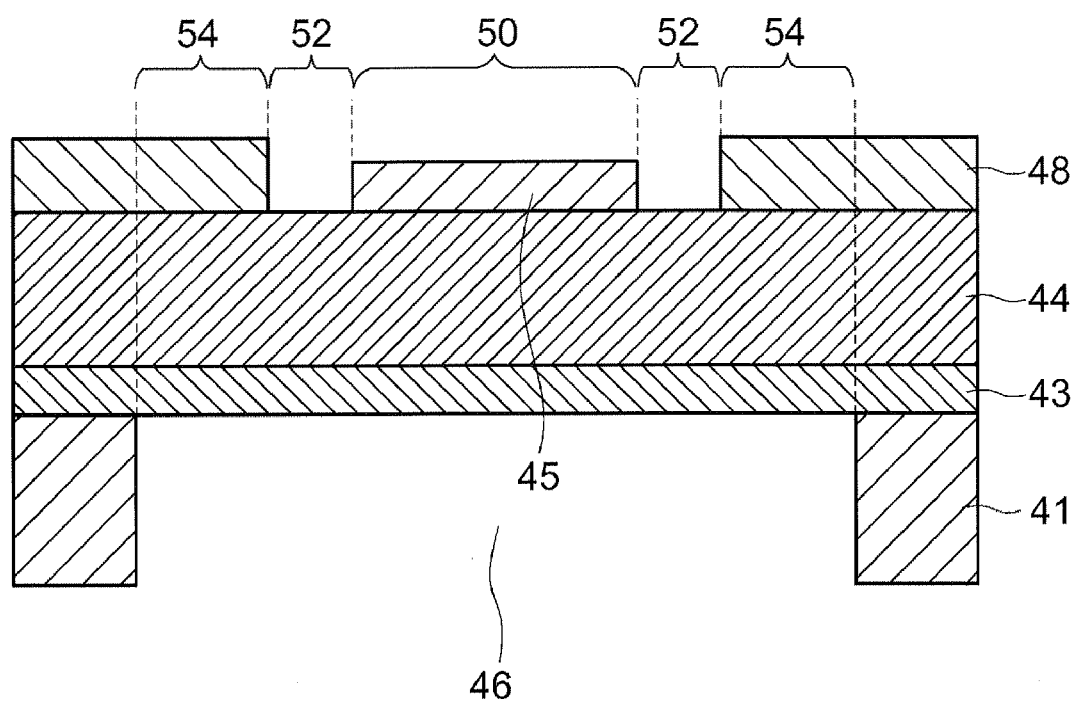
FIG. 25 illustrates a schematic cross sectional view of a film bulk acoustic resonator in accordance with a fourth embodiment.

FIG. 25 illustrates a schematic cross sectional view of a resonator in accordance with a fourth embodiment. As shown in FIG. 25, the support region 52 is composed of the lower electrode 43 and the piezoelectric film 44 on the void 46. The adjacent region 54 is composed of the lower electrode 43, the piezoelectric film 44 and a weight adding film 48 on the void 46. The void 46, the lower electrode 43 and the piezoelectric film 44 are formed in the resonance region 50, the support region 52 and the adjacent region 54. The upper electrode 45 is formed in the resonance region 50. The weight adding film 48 is formed in the adjacent region 54. The weight adding film 48 is composed of Ru and has a thickness of 255 nm. The other structure is the same as that of the first embodiment shown in FIG. 13.

Figure 26:
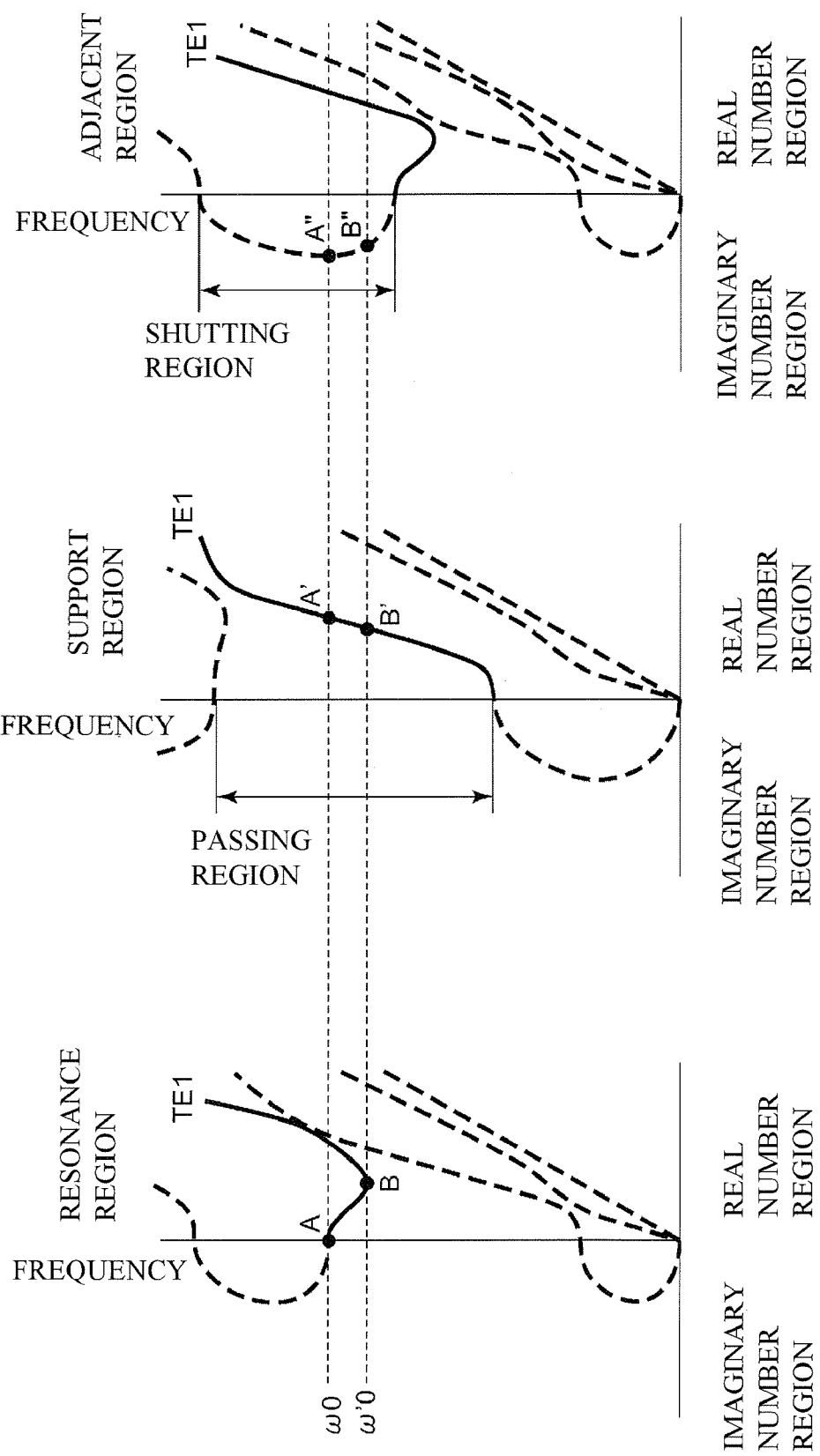
FIG. 26A through FIG. 26C illustrate a schematic view of a dispersion property of the film bulk acoustic resonator in accordance with the fourth embodiment.

FIG. 26A through FIG. 26C illustrate a schematic view of the calculated dispersion property of the resonance region 50, the support region 52 and the adjacent region 54 in the resonator in accordance with the fourth embodiment. FIG. 26A corresponds to FIG. 15A. As shown in FIG. 26B, in the support region 52, the dispersion curve of the TE1 mode is in the real number region at a frequency between the ω0 and the ω'0 where the spurious is generated. Therefore, a wave propagating in the lateral direction passes through the support region 52. As shown in FIG. 26C, in the adjacent region 54, the dispersion curve of the TE1 mode is in the imaginary number region at the frequency between the ω0 and the ω'0. Therefore, a wave propagating in the lateral direction is reflected at the adjacent region 54.

Fifth Embodiment

Figure 27:
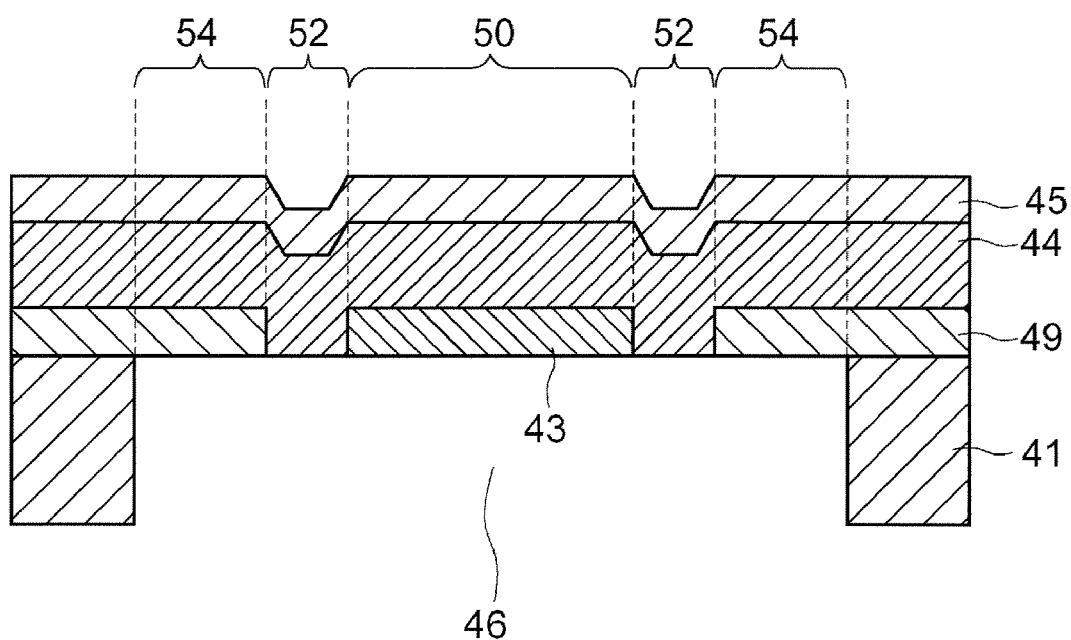
FIG. 27 illustrates a schematic cross sectional view of a film bulk acoustic resonator in accordance with a fifth embodiment.

FIG. 27 illustrates a schematic cross sectional view of a resonator in accordance with a fifth embodiment. As shown in FIG. 27, the support region 52 is composed of the piezoelectric film 44 and the upper electrode 45 on the void 46. The adjacent region 54 is composed of a weight adding film 49, the piezoelectric film 44 and the upper electrode 45 on the void 46. The void 46, the piezoelectric film 44 and the upper electrode 45 are formed in the resonance region 50, the support region 52 and the adjacent region 54. The lower electrode 43 is formed in the resonance region 50. The weight adding film 49 is formed in the adjacent region 54. The other structure is the same as that of the fourth embodiment shown in FIG. 15.

Figure 28C:
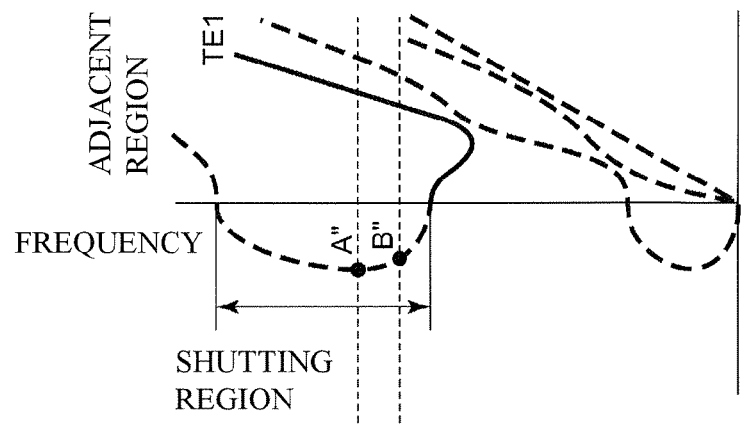
FIG. 28A through FIG. 28C illustrate a schematic view of the film bulk acoustic resonator in accordance with the fifth embodiment.
Figure 28B:
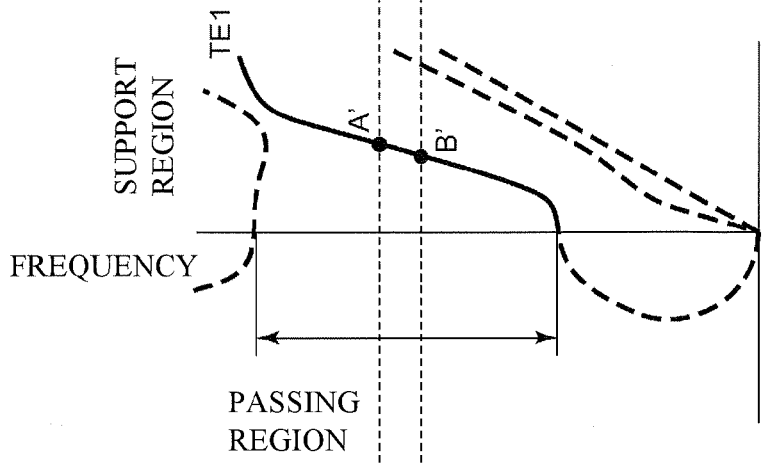
Figure 28A:
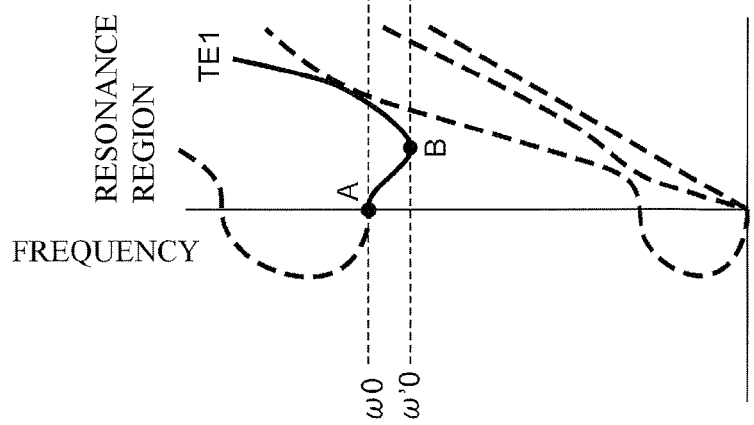

FIG. 28A through FIG. 28C illustrate a schematic view of the calculated dispersion property of the resonance region 50, the support region 52 and the adjacent region 54 in the resonator in accordance with the fifth embodiment. FIG. 28A corresponds to FIG. 15A. As shown in FIG. 28B, in the support region 52, the dispersion curve of the TE1 mode is in the real number region at a frequency between the ω0 and the ω'0 where the spurious is generated. Therefore, a wave propagating in the lateral direction passes through the support region 52. As shown in FIG. 28C, in the adjacent region 54, the dispersion curve of the TE1 mode is in the imaginary number region at the frequency between the ω0 and the ω'0. Therefore, a wave propagating in the lateral direction is reflected at the adjacent region 54.

The spurious is restrained in the structure in which the support region 52 is composed of the piezoelectric film 44 and one of the lower electrode 43 and the upper electrode 45 on the void 46, and the adjacent region 54 is composed of the piezoelectric film 44, one of the lower electrode 43 and the upper electrode 45, and the weight adding film 48 or 49, as is the case of the fourth embodiment and the fifth embodiment. The weight adding films 48 and 49 may be a metal film such as Ru, Mo, Al, Ti, Cr or Au, an insulating film such as silicon oxide, silicon nitride, aluminum oxide or aluminum nitride, or a lamination film composed of the above-mentioned metal film and the above-mentioned insulating film.

Further, the spurious is more restrained when the width L of the support region 52 is more than 0.35 times the wavelength λ of the wave propagating in the lateral direction and less than 0.65 times the wavelength λ, as is the case of the first embodiment through the third embodiment.

Sixth Embodiment

Figure 29:
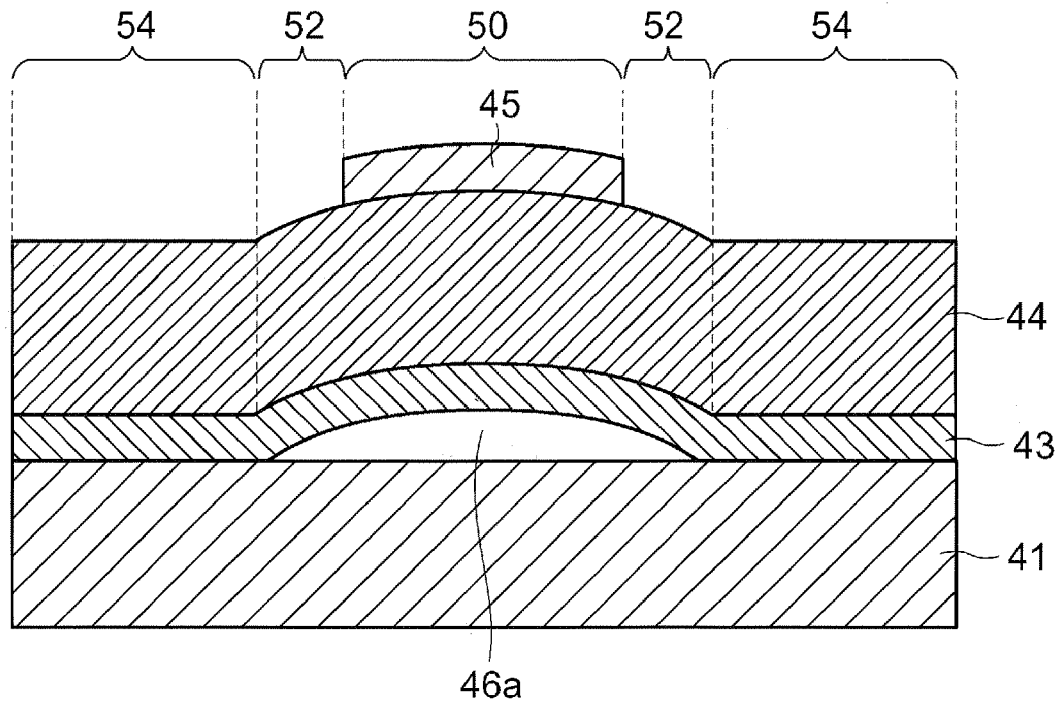
FIG. 29 illustrates a schematic cross sectional view of a film bulk acoustic resonator in accordance with a sixth embodiment.

As shown in FIG. 29, in a film bulk acoustic resonator in accordance with a sixth embodiment, the substrate 41 has no void, and the lower electrode 43 is formed so that a void (cavity) 46a is formed between the lower electrode 43 and the substrate 41. The void 46a is dome-shaped. The other structure is the same as that of the first embodiment shown in FIG. 13.

In the sixth embodiment, the spurious is restrained, as is the case of the first embodiment. The void 46 in accordance with the second embodiment through the fifth embodiment may be the void 46a formed between the substrate 41 and the lower electrode 43, as is the case of the sixth embodiment. The film bulk acoustic resonator may be of a via-hole type or of a cavity type.

Seventh Embodiment

A seventh embodiment is an example of a filter in which more than one of the film bulk acoustic resonator in accordance with the first embodiment through the sixth embodiment is combined. In the seventh embodiment, the resonator in accordance with one of the first embodiment through the sixth embodiment is used as a ladder type filter shown in FIG. 3. In the resonator in accordance with the first embodiment through the sixth embodiment, the spurious is restrained. It is therefore possible to improve a transmitting property of the filter in accordance with the seventh embodiment.

It is possible to restrain the spurious when one of the film bulk acoustic resonators in accordance with the first embodiment through the sixth embodiment is used for one of the filters. It is preferable that one of the film bulk acoustic resonators in accordance with the first embodiment through the sixth embodiment is used for all of the filters. Further, the film bulk acoustic resonators in accordance with the first embodiment through the sixth embodiment may be used for a filter other than the ladder type filter.

While the above description constitutes the preferred embodiments of the present invention, it will be appreciated that the invention is susceptible of modification, variation and change without departing from the proper scope and fair meaning of the accompanying claims.

The present application is based on Japanese Patent Application No. 2006-337711 filed Dec. 15, 2006, the entire disclosure of which is hereby incorporated by reference.

What is claimed is:

1. A film bulk acoustic resonator comprising:
a lower electrode that is formed on a void of a substrate or is formed so that a void is formed between the lower electrode and the substrate;
a piezoelectric film that is formed on the lower electrode;
an upper electrode that is formed on the piezoelectric film so as to have a resonance region facing the lower electrode through the piezoelectric film;
a support region that is provided around the resonance region, has a width of 0.35 times to 0.65 times a wavelength of a wave propagating in a lateral direction, and is composed of the lower electrode and the piezoelectric film on the void; and
an adjacent region that is provided around the support region and is composed of the substrate, the lower electrode and the piezoelectric film.

2. The film bulk acoustic resonator as claimed in claim 1, wherein a width of the support region is a half of a wavelength of a wave propagating in a lateral direction.

3. A film bulk acoustic resonator comprising:
a lower electrode that is formed on a void of a substrate or is formed so that a void is formed between the lower electrode and the substrate;
a piezoelectric film that is formed on the lower electrode;
an upper electrode that is formed on the piezoelectric film so as to have a resonance region facing the lower electrode through the piezoelectric film;
a support region that is provided around the resonance region, has a width of 0.35 times to 0.65 times a wavelength of a wave propagating in a lateral direction, and is composed of the piezoelectric film and the upper electrode on the void; and
an adjacent region that is provided around the support region and is composed of the substrate, the piezoelectric film and the upper electrode.

4. A film bulk acoustic resonator comprising:
a lower electrode that is formed on a void of a substrate or is formed so that a void is formed between the lower electrode and the substrate;
a piezoelectric film that is formed on the lower electrode;
an upper electrode that is formed on the piezoelectric film so as to have a resonance region facing the lower electrode through the piezoelectric film;
a support region that is provided around the resonance region, has a width of 0.35 times to 0.65 times a wavelength of a wave propagating in a lateral direction, and is composed of the piezoelectric film and one of the lower electrode and the upper electrode on the void; and
an adjacent region that is provided around the support region and is composed of the piezoelectric film on the void.

5. A filter comprising a film bulk acoustic resonator having a lower electrode, a piezoelectric film, an upper electrode, a support region, and an adjacent region,
the lower electrode being formed on a void of a substrate or is formed so that a void is formed between the lower electrode and the substrate,
the piezoelectric film being formed on the lower electrode,
the upper electrode being formed on the piezoelectric film so as to have a resonance region facing the lower electrode through the piezoelectric film,
the support region being provided around the resonance region and having a width of 0.35 times to 0.65 times a wavelength of a wave propagating in a lateral direction, and being composed of the lower electrode and the piezoelectric film on the void, and
the adjacent region being provided around the support region and being composed of the substrate, the lower electrode and the piezoelectric film.

6. A film bulk acoustic resonator comprising:
a lower electrode that is formed on a void of a substrate or is formed so that a void is formed between the lower electrode and the substrate;
a piezoelectric film that is formed on the lower electrode;
an upper electrode that is formed on the piezoelectric film so as to have a resonance region facing the lower electrode through the piezoelectric film;
a support region that is provided around the resonance region and is composed of the piezoelectric film and the upper electrode on the void; and
an adjacent region that is provided around the support region and is composed of the piezoelectric film, the upper electrode, and a weight adding film on the void;
wherein the weight adding film is formed under the piezoelectric film.

7. A filter comprising a film bulk acoustic resonator having a lower electrode, a piezoelectric film, an upper electrode, a support region and an adjacent region,
the lower electrode being formed on a void of a substrate or being formed so that a void is formed between the lower electrode and the substrate;
the piezoelectric film being formed on the lower electrode;
the upper electrode being formed on the piezoelectric film so as to have a resonance region facing the lower electrode through the piezoelectric film;
the support region being provided around the resonance region and having a width of 0.35 times to 0.65 times a wavelength of a wave propagating in a lateral direction, and being composed of the piezoelectric film and the upper electrode on the void; and
the adjacent region being provided around the support region and being composed of the substrate, the piezoelectric film and the upper electrode.

8. A filter comprising a film bulk acoustic resonator having a lower electrode, a piezoelectric film, an upper electrode, a support region and an adjacent region,
the lower electrode being formed on a void of a substrate or is formed so that a void is formed between the lower electrode and the substrate;
the piezoelectric film being formed on the lower electrode;
the upper electrode being formed on the piezoelectric film so as to have a resonance region facing the lower electrode through the piezoelectric film;
the support region being provided around the resonance region and having a width of 0.35 times to 0.65 times a wavelength of a wave propagating in a lateral direction, and being composed of the piezoelectric film and one of the lower electrode and the upper electrode on the void; and
the adjacent region being provided around the support region and being composed of the piezoelectric film on the void.

9. A filter comprising a film bulk acoustic resonator having a lower electrode, a piezoelectric film, an upper electrode, a support region and an adjacent region,
the lower electrode being formed on a void of a substrate or being formed so that a void is formed between the lower electrode and the substrate;

the piezoelectric film being formed on the lower electrode;

the upper electrode being formed on the piezoelectric film so as to have a resonance region facing the lower electrode through the piezoelectric film;

the support region being provided around the resonance region and being composed of the piezoelectric film and the upper electrode on the void; and the adjacent region being provided around the support region and being composed of the piezoelectric film, the upper electrode, and a weight adding film on the void;

wherein the weight adding film is formed under the piezoelectric film.

* * * * *